(12) United States Patent
Kim et al.

(10) Patent No.: US 11,195,910 B2
(45) Date of Patent: Dec. 7, 2021

(54) SEMICONDUCTOR DEVICE

(71) Applicant: Samsung Electronics Co., Ltd., Suwon-si (KR)

(72) Inventors: Young-Hun Kim, Seoul (KR); Jae Seok Yang, Hwaseong-si (KR); Hae Wang Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 16/214,659

(22) Filed: Dec. 10, 2018

(65) Prior Publication Data

US 2019/0386099 A1 Dec. 19, 2019

(30) Foreign Application Priority Data

Jun. 14, 2018 (KR) .................. 10-2018-0068000

(51) Int. Cl.
*H01L 29/06* (2006.01)
*H01L 29/66* (2006.01)
*H01L 29/423* (2006.01)
*H01L 27/092* (2006.01)
*H01L 29/78* (2006.01)
*H01L 29/49* (2006.01)

(52) U.S. Cl.
CPC ...... *H01L 29/0649* (2013.01); *H01L 27/0924* (2013.01); *H01L 29/42376* (2013.01); *H01L 29/4916* (2013.01); *H01L 29/6656* (2013.01); *H01L 29/6681* (2013.01); *H01L 29/7851* (2013.01)

(58) Field of Classification Search
CPC ............ H01L 29/0649; H01L 29/6656; H01L 29/42376; H01L 27/0924; H01L 29/7851; H01L 29/6681; H01L 29/4916
See application file for complete search history.

(56) References Cited

U.S. PATENT DOCUMENTS

| | | | |
|---|---|---|---|
| 9,406,676 B2 | 8/2016 | Yu et al. | |
| 9,704,862 B2 | 7/2017 | Park et al. | |
| 9,831,272 B2 | 11/2017 | Chen et al. | |
| 9,887,210 B2 | 2/2018 | Song et al. | |
| 10,249,730 B1* | 4/2019 | Belyansky | .......... H01L 29/7831 |
| 2014/0167177 A1* | 6/2014 | Kim | .................... H01L 27/1104 |
| | | | 257/369 |

(Continued)

*Primary Examiner* — Marcos D. Pizarro
*Assistant Examiner* — Quinton A Brasfield
(74) *Attorney, Agent, or Firm* — Muir Patent Law, PLLC

(57) ABSTRACT

A semiconductor device is provided. The semiconductor device comprising a first fin pattern and a second fin pattern which are separated by a first isolation trench and extend in a first direction, a third fin pattern which is spaced apart from the first fin pattern in a second direction intersecting the first direction and extends in the first direction, a fourth fin pattern which is separated from the third fin pattern by a second isolation trench, a first gate structure which intersects the first fin pattern and has a portion extending along an upper surface of the first fin pattern, a second gate structure which intersects the second fin pattern and has a portion extending along an upper surface of the second fin pattern and a first element isolation structure which fills the second isolation trench and faces a short side of the first gate structure.

20 Claims, 34 Drawing Sheets

(56) References Cited

U.S. PATENT DOCUMENTS

| | | | |
|---|---|---|---|
| 2016/0155741 A1* | 6/2016 | Yoo | H01L 27/0924 |
| | | | 257/369 |
| 2016/0247876 A1* | 8/2016 | Chung | H01L 21/823821 |
| 2017/0200651 A1* | 7/2017 | Lee | H01L 21/76224 |
| 2017/0221769 A1* | 8/2017 | Park | H01L 21/823828 |
| 2018/0006035 A1 | 1/2018 | Yuan et al. | |
| 2020/0051976 A1* | 2/2020 | Ha | H01L 21/823878 |

* cited by examiner

SEMICONDUCTOR DEVICE

This application claims the benefit of priority under 35 USC § 119 to Korean Patent Application No. 10-2018-0068000, filed on Jun. 14, 2018, in the Korean Intellectual Property Office, the disclosure of which is incorporated herein in its entirety by reference.

BACKGROUND

1. Field

The present disclosure relates to a semiconductor device.

2. Description of the Related Art

As one of the scaling techniques for increasing the density of a semiconductor device, a multi-gate transistor has been suggested. The multi-gate transistor may be obtained by forming a fin- or nanowire-shaped multi-channel active pattern (or silicon body) on a substrate and forming gates on the surface of the multi-channel active pattern.

The multi-gate transistor can be easily scaled because it uses a three-dimensional (3D) channel. In addition, the current control capability of the multi-gate transistor can be improved without the need to increase the gate length of the multi-gate transistor. Moreover, it is possible to effectively suppress a short channel effect (SCE) in which an electric potential of a channel region is affected by a drain voltage.

SUMMARY

Aspects of the present disclosure provide a semiconductor device with increased element integration density and improved reliability and performance.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some embodiments of the present disclosure, there is provided a semiconductor device comprising a first fin pattern and a second fin pattern which are separated by a first isolation trench and extend in a first direction, a third fin pattern which is spaced apart from the first fin pattern in a second direction intersecting the first direction and extends in the first direction, a fourth fin pattern which is separated from the third fin pattern by a second isolation trench, a first gate structure which intersects the first fin pattern and has a portion extending along an upper surface of the first fin pattern, a second gate structure which intersects the second fin pattern and has a portion extending along an upper surface of the second fin pattern and a first element isolation structure which fills the second isolation trench and faces a short side of the first gate structure.

According to some embodiments of the present disclosure, there is provided a semiconductor device comprising a first fin pattern and a second fin pattern aligned in a first direction which is a longitudinal direction, a third fin pattern which is spaced apart from the first fin pattern in a second direction intersecting the first direction and extends in the first direction, a fourth fin pattern which is separated from the third fin pattern by a first isolation trench, a first gate structure which intersects the first fin pattern and has a portion extending along an upper surface of the first fin pattern, a second gate structure which intersects the second fin pattern and has a portion extending along an upper surface of the second fin pattern, a third gate structure which intersects the first fin pattern and the third fin pattern and a first element isolation structure which fills the first isolation trench, wherein an upper surface of the first element isolation structure is higher than an upper surface of the third fin pattern.

According to some embodiments of the present disclosure, there is provided a semiconductor device comprising a first fin pattern and a second fin pattern which are disposed in an n-type metal oxide semiconductor (NMOS) region and aligned in a first direction which is a longitudinal direction, a third fin pattern which is disposed in a p-type metal oxide semiconductor (PMOS) region, is spaced apart from the first fin pattern in a second direction intersecting the first direction and extends in the first direction, a fourth fin pattern which is separated from the third fin pattern by a first isolation trench, a first gate structure which intersects the first fin pattern and has a portion extending along an upper surface of the first fin pattern, a second gate structure which intersects the second fin pattern and has a portion extending along an upper surface of the second fin pattern, a first element isolation structure which fills the first isolation trench and a gate insulating support which is formed between the first gate structure and the first element isolation structure to contact the first gate structure and the first element isolation structure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
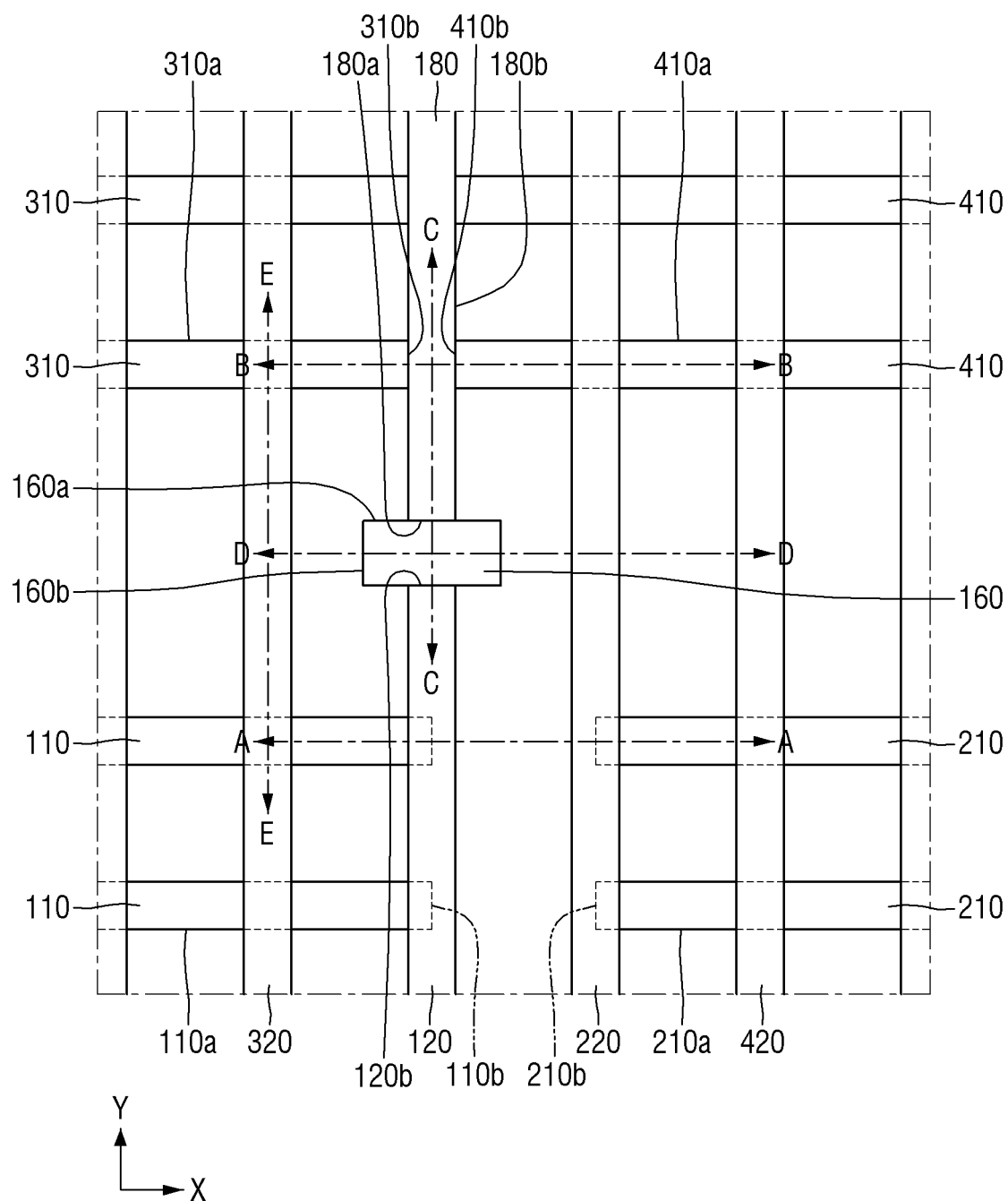
FIG. 1 is a schematic plan view of a semiconductor device according to embodiments.

In the drawings relating to semiconductor devices according to embodiments, a fin field effect transistor (FinFET) including a channel region of a fin pattern shape is illustrated by way of example. However, embodiments are not limited to the FinFET. The semiconductor devices according to the embodiments may also include a tunneling FET, a transistor including nanowires, a transistor including a nanosheet, or a three-dimensional (3D) transistor. In addition, the semiconductor devices according to the embodiments may include a bipolar junction transistor, a lateral double diffusion transistor (LDMOS), or the like.

Figure 2:
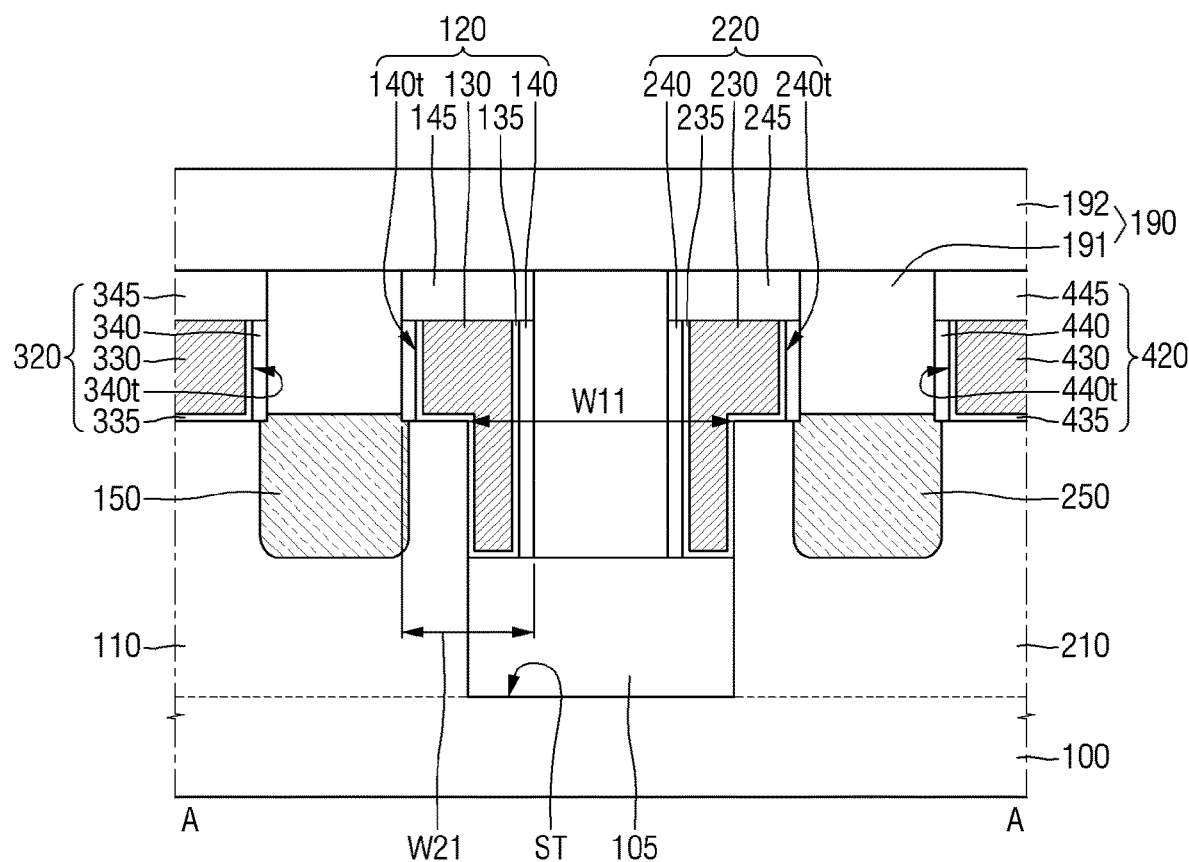
FIG. 2 is a cross-sectional view taken along line A-A of FIG. 1.
Figure 3:
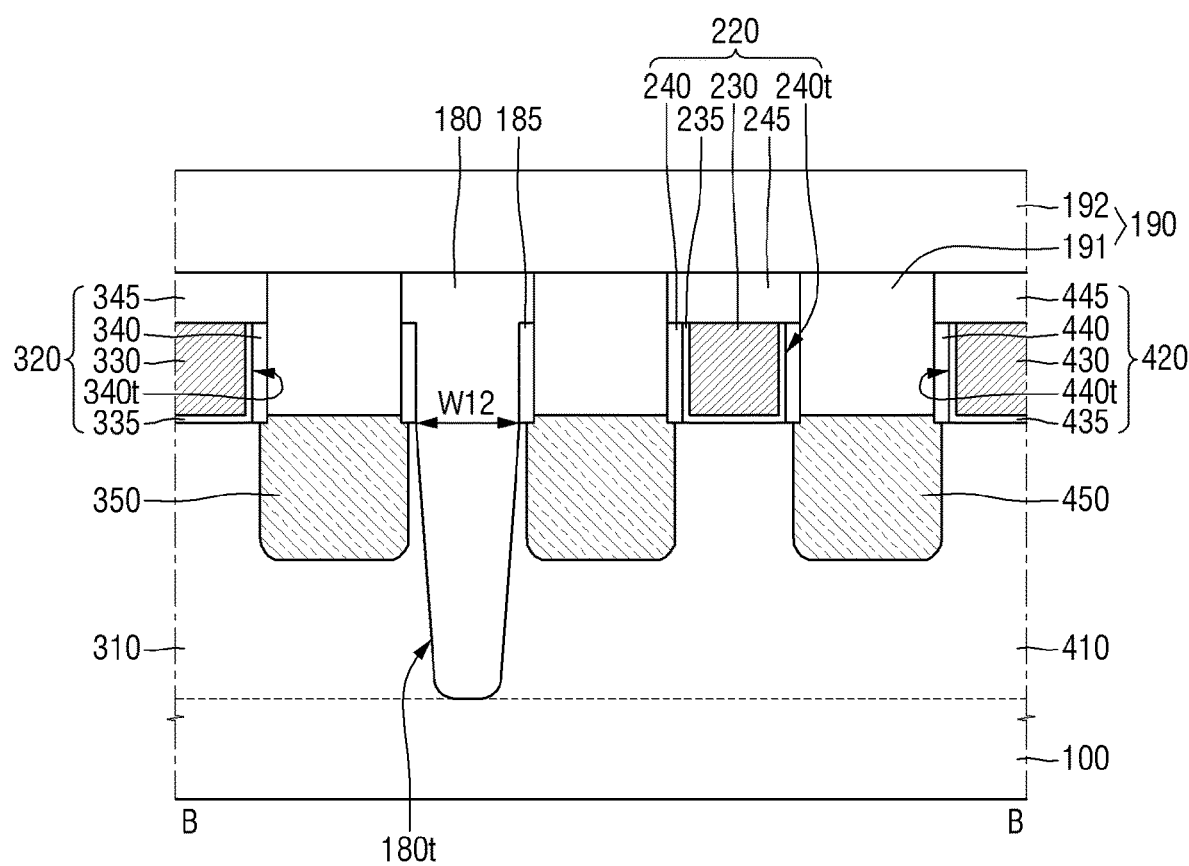
FIG. 3 is a cross-sectional view taken along line B-B of FIG. 1.
Figure 4:
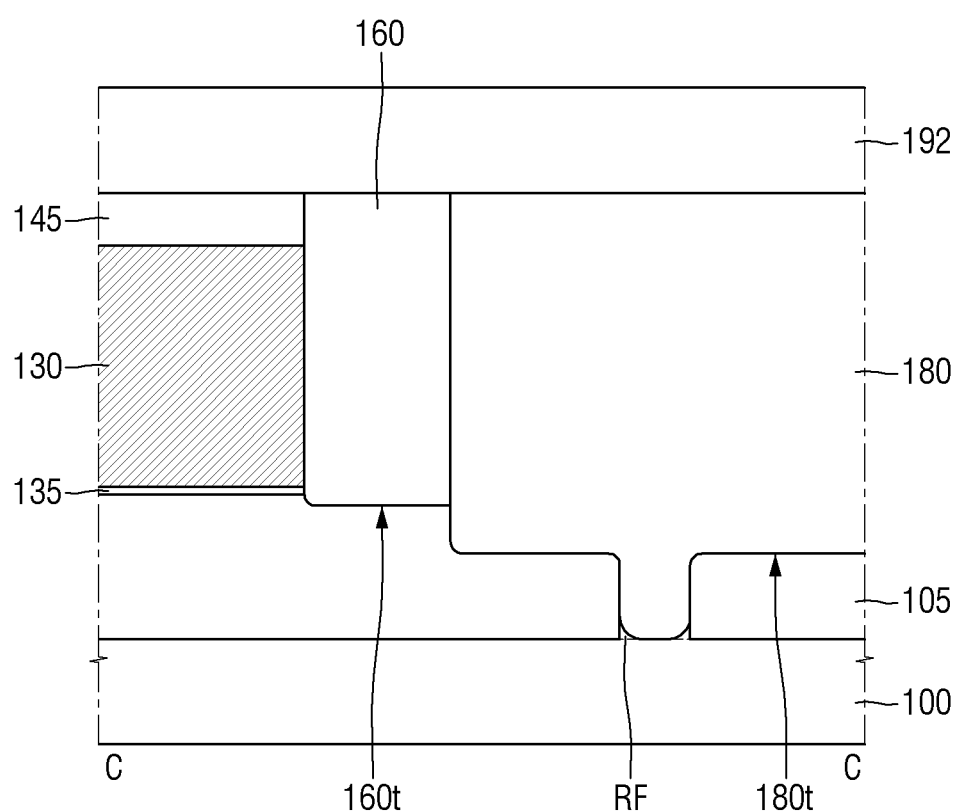
FIG. 4 is a cross-sectional view taken along line C-C of FIG. 1.
Figure 5:
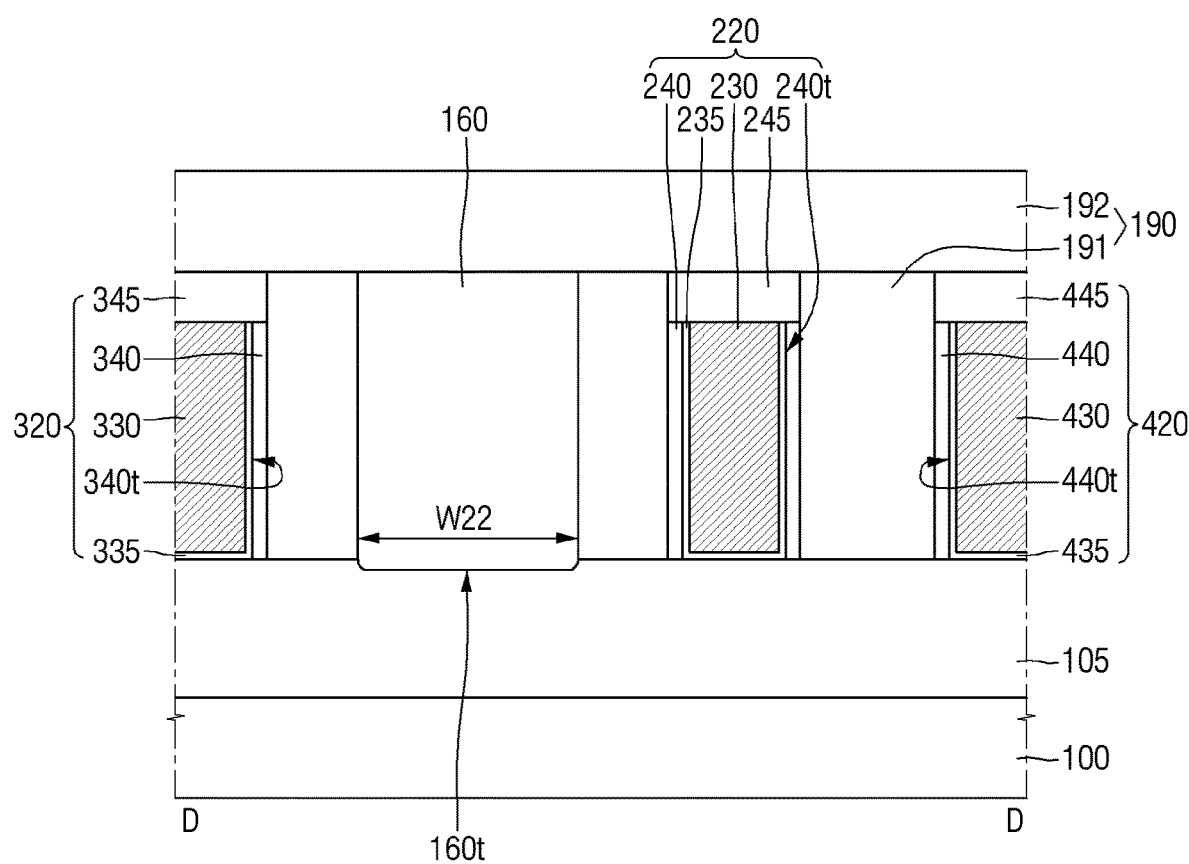
FIG. 5 is a cross-sectional view taken along line D-D of FIG. 1.
Figure 6:
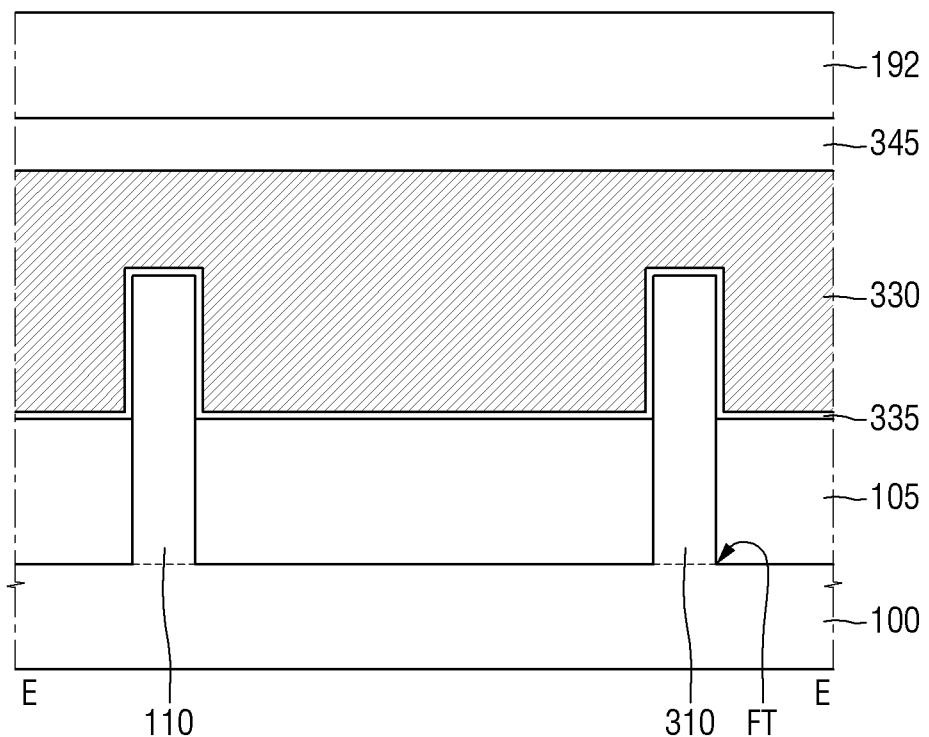
FIG. 6 is a cross-sectional view taken along line E-E of FIG. 1.

FIG. 1 is a schematic plan view of a semiconductor device according to embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIG. 5 is a cross-sectional view taken along line D-D of FIG. 1. FIG. 6 is a cross-sectional view taken along line E-E of FIG. 1. For ease of description, a lower interlayer insulating film 191 and an upper interlayer insulating film 192 are not illustrated in FIG. 1.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Referring to FIGS. 1 through 6, the semiconductor device according to the embodiments includes first fin patterns 110, second fin patterns 210, third fin patterns 310 and fourth fin patterns 410, first gate structure 120, second gate structure 220, third gate structure 320, and fourth gate structure 420, a gate insulating support 160, and a first element isolation structure 180.

A substrate 100 may be a bulk silicon substrate or a silicon-on-insulator (SOI) substrate. Otherwise, the substrate 100 may be, but is not limited to, a silicon substrate or a substrate made of another material such as silicon germanium, silicon germanium-on-insulator (SGOI), indium antimonide, lead telluride, indium arsenide, indium phosphide, gallium arsenide, or gallium antimonide.

Each of the first through fourth fin patterns 110, 210, 310, and 410 may protrude from the substrate 100. Each of the first through fourth fin patterns 110, 210, 310, and 410 may extend on the substrate 100 along a first direction X. For example, each of the first through fourth fin patterns 110, 210, 310, and 410 may include long sides extending in the first direction X and short sides extending in a second direction Y perpendicular to the first direction X. Each of the first through fourth fin patterns 110, 210, 310, and 410 may be defined by a fin trench FT. For example, each of long sides 110a, 210a, 310a and 410a of the first through fourth fin patterns 110, 210, 310, and 410 may be defined by the fin trench FT.

The first and second fin patterns 110 and 210 may be aligned in the first direction X which is a longitudinal direction. The first fin patterns 110 may be spaced apart from the second fin patterns 210 in the first direction X. Short sides 110b of the first fin patterns 110 and short sides 210b of the second fin patterns 210 may face each other. The first fin patterns 110 and the second fin patterns 210 may be separated by a fin-cut trench ST.

The third and fourth fin patterns 310 and 410 may be aligned in the first direction X which is the longitudinal direction. The third fin patterns 310 may be spaced apart from the fourth fin patterns 410 in the first direction X. Short sides 310b of the third fin patterns 310 and short sides 410b of the fourth fin patterns 410 may face each other. The third fin patterns 310 and the fourth fin patterns 410 may be separated by a first isolation trench 180t. For example, a width W11 of the fin-cut trench ST in the first direction X is greater than a width W12 of the first isolation trench 180t in the first direction X based on upper surfaces of the first through fourth fin patterns 110, 210, 310, and 410.

The third and fourth fin patterns 310 and 410 may be spaced apart from the first fin patterns 110 in the second direction Y. The long sides 310a of the third fin patterns 310 may face the long sides 110a of the first fin patterns 110, and the long sides 410a of the fourth fin patterns 410 may face the long sides 210a of the second fin patterns 210. Although each of the first through fourth fin patterns 110, 210, 310, and 410 is illustrated as being plural, embodiments are not limited to this case.

When the first and second fin patterns 110 and 210 are formed in a first region and the third and fourth fin patterns 310 and 410 are formed in a second region, the first region and the second region may be regions in which transistors of the same conductivity type are formed or may be regions in which transistors of different conductivity types are formed.

In the following description, it is assumed that the first and second fin patterns 110 and 210 are formed in an n-type metal oxide semiconductor (NMOS) region and the third and fourth fin patterns 310 and 410 are formed in a p-type metal oxide semiconductor (PMOS) region.

Each of the first through fourth fin patterns 110, 210, 310, and 410 may be a part of the substrate 100 or may include an epitaxial layer grown from the substrate 100. Each of the first through fourth fin patterns 110, 210, 310, and 410 may include an elemental semiconductor material such as silicon or germanium. In addition, each of the first through fourth fin patterns 110, 210, 310, and 410 may include a compound semiconductor such as a group IV-IV compound semiconductor or a group III-V compound semiconductor. The group IV-IV compound semiconductor may be, e.g., a binary or ternary compound including two or more of carbon (C), silicon (Si), germanium (Ge) and tin (Sn) or a compound obtained by doping the binary or ternary compound with a group IV element. The group III-V compound semiconductor may be, e.g., a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

A field insulating layer 105 may be formed on the substrate 100. The field insulating layer 105 may at least partially fill the fin-cut trench ST and the fin trench FT. The field insulating layer 105 may be disposed on a part of sidewalls of each of the first through fourth fin patterns 110, 210, 310, and 410.

The upper surfaces of the first through fourth fin patterns 110, 210, 310, and 410 may protrude above an upper surface of the field insulating layer 105. The field insulating layer 105 may include at least one of, for example, a silicon oxide layer, a silicon nitride layer, and a silicon oxynitride layer. In the semiconductor device according to the embodiments, the field insulating layer 105 may fill a part of the fin-cut trench ST.

Each of first through fourth gate structures 120, 220, 320, and 420 may extend on the field insulating layer 105 in the second direction Y. The first gate structure 120 may be disposed on the first fin patterns 110 to intersect the first fin patterns 110. The first gate structure 120 may overlap ends of the first fin patterns 110 including the short sides 110b of the first fin patterns 110. A portion of the first gate structure 120 may extend along the upper surface of each of the first fin patterns 110.

The second gate structure 220 may be disposed on the second and fourth fin patterns 210 and 410 to intersect the second and fourth fin patterns 210 and 410. The second gate structure 220 may overlap ends of the second fin patterns 210 including the short sides 210b of the second fin patterns 210. A portion of the second gate structure 220 may extend along the upper surface of each of the second fin patterns 210.

The third gate structure 320 may be disposed on the first and third fin patterns 110 and 310 to intersect the first and third fin patterns 110 and 310. The fourth gate structure 420 may be disposed on the second and fourth fin patterns 210 and 410 to intersect the second and fourth fin patterns 210 and 410. The third and fourth gate structures 320 and 420 do not overlap the ends of the first and second fin patterns 110 and 210, respectively.

In the semiconductor device according to the embodiments, the first gate structure 120 may cover the ends of the first fin patterns 110, and the second gate structure 220 may cover the ends of the second fin patterns 210. The first gate structure 120 may cover the sidewalls of the first fin patterns 110 which define the short sides 110b of the first fin patterns 110. The second gate structure 220 may cover the sidewalls of the second fin patterns 210 which define the short sides 210b of the second fin patterns 210.

The first through fourth gate structures 120, 220, 320, and 420 may include first through fourth gate electrodes 130, 230, 330, and 430, first through fourth gate insulating layers 135, 235, 335, and 435, first through fourth gate spacers 140, 240, 340, and 440, first through fourth gate trenches 140t, 240t, 340t, and 440t defined by the first through fourth gate spacers 140, 240, 340, and 440, and first through fourth capping patterns 145, 245, 345, and 445, respectively.

The first through fourth gate insulating layers 135, 235, 335, and 435 may extend along sidewalls and bottom surfaces of the first through fourth gate trenches 140t, 240t, 340t, and 440t, respectively. Each of the first through fourth gate insulating layers 135, 235, 335, and 435 may include a high dielectric constant insulating layer.

The high dielectric constant insulating layer may include a high dielectric material having a higher dielectric constant than a silicon oxide layer. Each of the first through fourth gate insulating layers 135, 235, 335, and 435 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first through fourth gate electrodes 130, 230, 330, and 430 may be disposed on the first through fourth gate insulating layers 135, 235, 335, and 435, respectively. The first through fourth gate electrodes 130, 230, 330, and 430 may at least partially fill the first through fourth gate trenches 140t, 240t, 340t, and 440t, respectively.

Each of the first through fourth gate electrodes 130, 230, 330, and 430 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations of the same.

The first through fourth gate spacers 140, 240, 340, and 440 may be formed on sidewalls of the first through fourth gate electrodes 130, 230, 330, and 430, respectively. Each of the first through fourth gate spacers 140, 240, 340, and 440 may include at least one of, for example, silicon nitride (SiN), silicon oxynitride (SiON), silicon oxide ($SiO_2$), and silicon oxycarbonitride (SiOCN).

The first through fourth capping patterns 145, 245, 345, and 445 may be formed on the first through fourth gate electrodes 130, 230, 330, and 430 and the first through fourth gate spacers 140, 240, 340, and 440, respectively.

Each of the first through fourth capping patterns 145, 245, 345, and 445 may include at least one of, for example, silicon oxide ($SiO_2$), silicon nitride (SiN), silicon oxynitride (SiON), silicon carbonitride (SiCN), and silicon oxycarbonitride (SiOCN).

In FIGS. 2, 3 and 5, the first through fourth capping patterns 145, 245, 345, and 445 are illustrated as not filling part of the first through fourth gate trenches 140t, 240t, 340t, and 440t, respectively. However, this is merely an example used for ease of description, and embodiments are not limited to this example.

A first epitaxial pattern 150 may be formed on each of the first fin patterns 110. A second epitaxial pattern 250 may be formed on each of the second fin patterns 210. A third epitaxial pattern 350 may be formed on each of the third fin patterns 310. A fourth epitaxial pattern 450 may be formed on each of the fourth fin patterns 410.

The first epitaxial pattern 150 may be included in a source/drain of a transistor using the first fin pattern 110 as a channel region. The second epitaxial pattern 250 may be included in a source/drain of a transistor using the second fin pattern 210 as a channel region. The third epitaxial pattern 350 may be included in a source/drain of a transistor using the third fin pattern 310 as a channel region. The fourth epitaxial pattern 450 may be included in a source/drain of a transistor using the fourth fin pattern 410 as a channel region.

The lower interlayer insulating film 191 may be formed on the field insulating layer 105 and may cover the first through fourth epitaxial patterns 150, 250, 350, and 450. The lower interlayer insulating film 191 may be formed around the first through fourth gate structures 120, 220, 320, and 420. The lower interlayer insulating film 191 may at least partially cover sidewalls of the first through fourth gate structures 120, 220, 320, and 420.

An upper surface of the lower interlayer insulating film 191 may lie in the same plane as an upper surface of each of the first through fourth capping patterns 145, 245, 345, and 445. A lower surface of the lower interlayer insulating film 191 may lie below a lower surface of each of the first through fourth capping patterns 145, 245, 345, and 445.

Although not illustrated, the lower interlayer insulating film 191 may further include an etch stop layer extending along upper surfaces of the first through fourth epitaxial patterns 150, 250, 350, and 450.

The first element isolation structure 180 may be disposed between the third fin patterns 310 and the fourth fin patterns 410. The first element isolation structure 180 may be disposed between the short sides 310b and 410b of the third and fourth fin patterns 310 and 410. The first element isolation structure 180 may separate the third fin patterns 310 and the fourth fin patterns 410. The first element isolation structure 180 may be disposed between the second gate structure 220 and the third gate structure 320.

The first element isolation structure 180 includes first sides 180a extending in the first direction X and second sides 180b extending in the second direction Y. A first side 180a of the first element isolation structure 180 may face a short side 120b of the first gate structure 120. The second sides 180b of the first element isolation structure 180 may face the short sides 310b and 410b of the third and fourth fin patterns 310 and 410.

The first element isolation structure 180 and the first gate structure 120 may be aligned in the second direction Y. The first element isolation structure 180 is disposed on an extension line of the first gate structure 120 extending in the second direction Y.

The first element isolation structure 180 may be disposed in the first isolation trench 180t included in the lower interlayer insulating film 191. The first element isolation structure 180 may fill the first isolation trench 180t. The first isolation trench 180t may be formed between the third epitaxial pattern 350 and the fourth epitaxial pattern 450.

Sidewalls of the first isolation trench 180t extending in the second direction Y between the third epitaxial pattern 350 and the fourth epitaxial pattern 450 may be defined by first dummy spacers 185, the lower interlayer insulating film 191, and the third and fourth fin patterns 310 and 410.

An upper surface of the first element isolation structure 180 is higher in the second direction Y than the upper surfaces of the third and fourth fin patterns 310 and 410 in the second direction Y. For example, the upper surface of the first element isolation structure 180 may lie in the same plane as the upper surface of the lower interlayer insulating film 191. The upper surface of the first element isolation structure 180 may lie in the same plane as upper surfaces of the second through fourth gate structures 220, 320, and 420.

In FIG. 3, a width between the sidewalls of the first isolation trench 180t defined by the third and fourth fin patterns 310 and 410 increases as the distance from the substrate 100 increases. For example, a width of the first isolation trench 180t in the first direction X between the sidewalls of the first isolation trench 180t defined by the third and fourth fin patterns 310 and 410 may gradually increase in an upward direction (second direction Y) away from an upper surface of the substrate 100. However, embodiments are not limited to this case. For example, according to alternative embodiments, a width between the sidewalls of the first isolation trench 180t defined by the third and fourth fin patterns 310 and 410 may not change as the distance from the substrate 100 increases.

In FIG. 4, a part of sidewalls of the first isolation trench 180t extending in the first direction X may be defined by the field insulating layer 105. A portion of the first isolation trench 180t may be, but not necessarily, recessed into the field insulating layer 105.

A bottom surface of the first isolation trench 180t may be defined by the field insulating layer 105, the substrate 100 and a remaining fin RF. The remaining fin RF may be a portion remaining after a fin pattern portion is removed in an etching process for forming the first isolation trench 180t. The remaining fin RF may also not be present, unlike in the drawing.

The first element isolation structure 180 may include at least one of, for example, silicon nitride, silicon oxide, silicon carbide, silicon carbonitride, silicon oxycarbide, silicon oxynitride, silicon oxycarbonitride, and aluminum oxide. Although the first element isolation structure 180 is illustrated as a single layer, this is merely an example used for ease of description, and the first element isolation structure 180 is not limited to a single layer.

The material composition of the first dummy spacers 185 and the first gate spacers 140 may be the same. Unlike in the drawings, the first dummy spacers 185 may not be disposed on sidewalls of the first element isolation structure 180.

The gate insulating support 160 may be disposed on the field insulating layer 105 between the first and third fin patterns 110 and 310. The gate insulating support 160 may be spaced apart from the first and third fin patterns 110 and 310 in the second direction Y.

The gate insulating support 160 may be disposed between the first gate structure 120 and the first element isolation structure 180. The gate insulating support 160 may be disposed on the field insulating layer 105 between the first gate structure 120 and the first element isolation structure 180.

The gate insulating support 160 may separate the first gate structure 120 and the first element isolation structure 180. The gate insulating support 160 may cross between the first gate structure 120 and the first element isolation structure 180. The first gate structure 120 and the first element isolation structure 180 may be disposed in the second direction Y with the gate insulating support 160 interposed between them.

The gate insulating support 160 contacts the first gate structure 120 and the first element isolation structure 180.

It will be understood that when an element is referred to as "contacting" or "in contact with" another element, there are no intervening elements present at the point of contact.

The gate insulating support 160 includes first sides 160a extending in the first direction X and second sides 160b extending in the second direction Y. The first gate structure 120 and the first element isolation structure 180 contact the first sides 160a of the gate insulating support 160.

In the semiconductor device according to the embodiments, a width W22 of the gate insulating support 160 in the first direction X (see FIG. 5) may be greater than or equal to a width W21 of the first gate structure 120 in the first direction X (see FIG. 2).

In FIGS. 1 and 5, the width W22 of the gate insulating support 160 in the first direction X is greater than the width W21 of the first gate structure 120 in the first direction X.

In addition, in FIGS. 1 and 5, the gate insulating support 160 is not in contact with the second and third gate structures 220 and 320. However, embodiments are not limited to this case.

The gate insulating support 160 may be disposed in an insulating trench 160t included in the lower interlayer insulating film 191. The gate insulating support 160 may fill the insulating trench 160t. In FIGS. 4 and 5, a part of sidewalls of the first insulating trench 160t may be recessed into the field insulating layer 105 and defined by the field insulating layer 105. However, embodiments are not limited to this case.

In FIG. 4, the bottom surface of the first isolation trench 180t defined by the field insulating layer 105 is illustrated as being closer to the substrate 100 than a bottom surface of the first insulating trench 160t. However, embodiments are not limited to this case.

The gate insulating support 160 may include at least one of, for example, silicon nitride, silicon oxide, silicon carbide, silicon carbonitride, silicon oxycarbide, silicon oxynitride, silicon oxycarbonitride, and aluminum oxide. Although the gate insulating support 160 is illustrated as a single layer in FIGS. 4 and 5, this is merely an example used for ease of description, and the gate insulating support 160 is not limited to a single layer.

In FIG. 4, the first gate insulating layer 135 does not extend along the sidewalls of the gate insulating support 160. The first gate electrode 130 may contact the gate insulating support 160. For example, a sidewall of the first gate electrode 130 extending in the second direction Y may contact a sidewall of the gate insulating support 160 extending in the second direction Y. In FIG. 5, an upper surface of the gate insulating support 160 may lie in the same plane as the upper surface of the lower interlayer insulating film 191. The upper surface of the gate insulating support 160 may lie in the same plane as the upper surfaces of the second through fourth gate structures 220, 320, and 420.

The upper interlayer insulating film 192 is formed on the lower interlayer insulating film 191, the gate insulating support 160, the first element isolation structure 180, and the first through fourth gate structures 120, 220, 320, and 420. An interlayer insulating film 190 includes the lower interlayer insulating film 191 and the upper interlayer insulating film 192. Each of the lower interlayer insulating film 191 and the upper interlayer insulating film 192 may include, but is not limited to, silicon oxide, silicon nitride, silicon oxynitride, flowable oxide (FOX), tonen silazen (TOSZ), undoped silica glass (USG), borosilica glass (BSG), phosphosilica glass (PSG), borophosphosilica glass (BPSG), plasma enhanced tetraethylorthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, a porous polymeric material, or a combination of the same.

Figure 7:
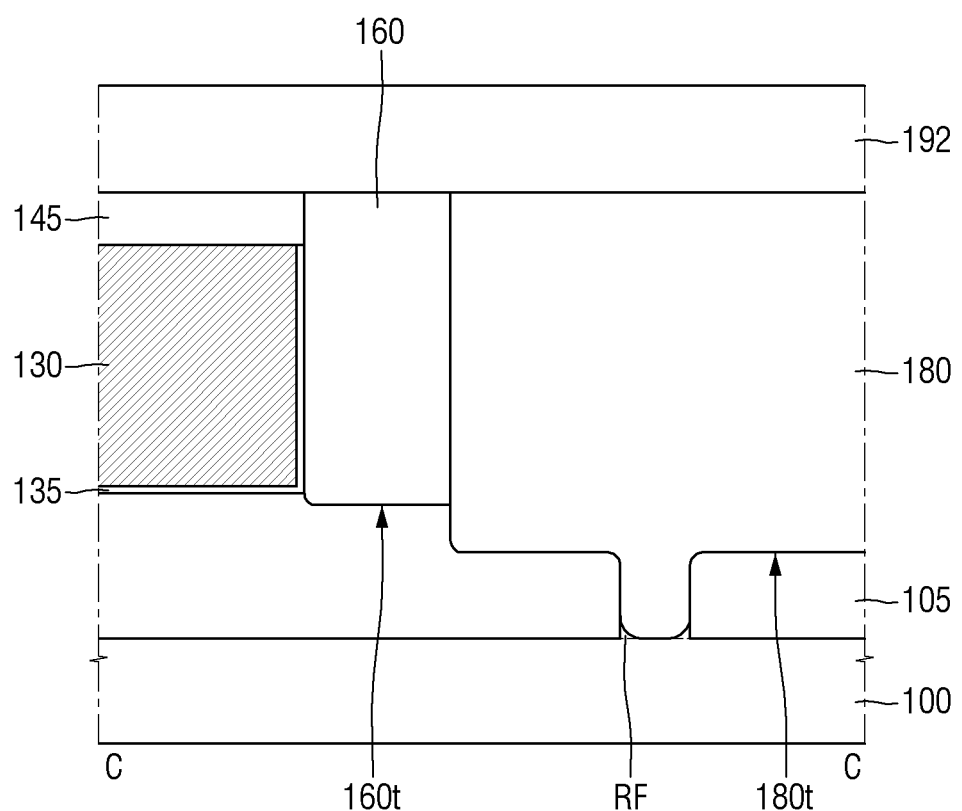
FIG. 7 illustrates a semiconductor device according to embodiments.
Figure 8:
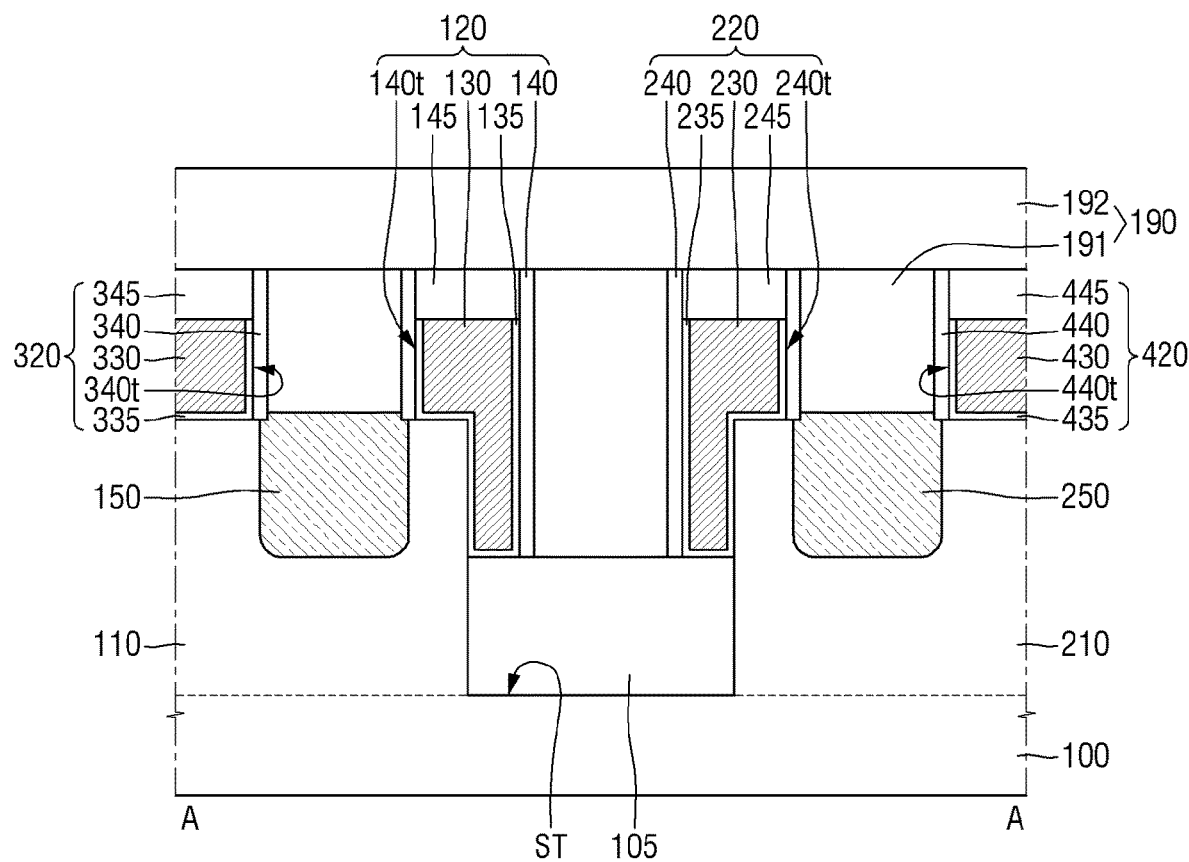
FIG. 8 illustrates a semiconductor device according to embodiments.
Figure 9:
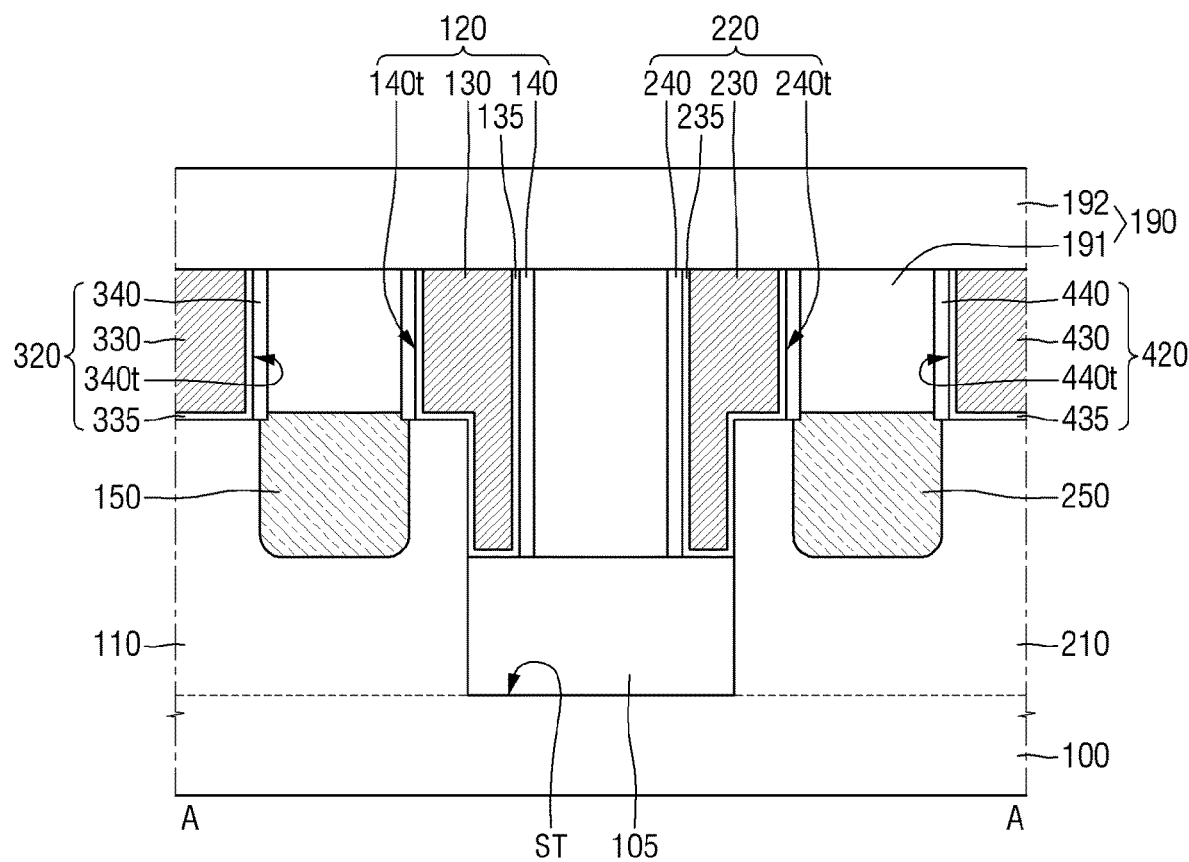
FIG. 9 illustrates a semiconductor device according to embodiments.

FIG. 7 illustrates a semiconductor device according to embodiments. FIG. 8 illustrates a semiconductor device according to embodiments. FIG. 9 illustrates a semiconductor device according to embodiments. For ease of description, the following embodiments will be described, focusing mainly on differences from elements and features described above with reference to FIGS. 1 through 6.

Referring to FIG. 7, in the semiconductor device according to the embodiments, a first gate insulating layer 135 includes a portion extending along a sidewall of a gate insulating support 160 in the second direction Y.

The first gate insulating layer 135 may extend between a first gate electrode 130 and the gate insulating support 160.

Referring to FIG. 8, in the semiconductor device according to the embodiments, first through fourth gate electrodes 130, 230, 330, and 430 may partially fill first through fourth gate trenches 140t, 240t, 340t, and 440t, respectively.

First through fourth capping patterns 145, 245, 345, and 445 may fill the first through fourth gate trenches 140t, 240t, 340t, and 440t remaining after the first through fourth gate electrodes 130, 230, 330, and 430 are formed, respectively. Upper surfaces of first through fourth gate spacers 140, 240, 340, and 440 may lie in the same plane as upper surfaces of the first through fourth capping patterns 145, 245, 345, and 445.

Although first through fourth gate insulating layers 135, 235, 335, and 435 are illustrated as not extending between the first through fourth capping patterns 145, 245, 345, and 445 and the first through fourth gate spacers 140, 240, 340, and 440 in the drawing, embodiments are not limited to this case.

Referring to FIG. 9, in the semiconductor device according to the embodiments, upper surfaces of first through fourth gate electrodes 130, 230, 330, and 430 may lie in the same plane as an upper surface of a lower interlayer insulating film 191.

The upper surfaces of the first through fourth gate electrodes 130, 230, 330, and 430 may lie in the same plane as an upper surface of a gate insulating support 160 (see FIG. 5) and an upper surface of a first element isolation structure 180 (see FIG. 3). First through fourth gate structures 120, 220, 320, and 420 may not include capping patterns 145, 245, 345, and 445, respectively.

Figure 10:
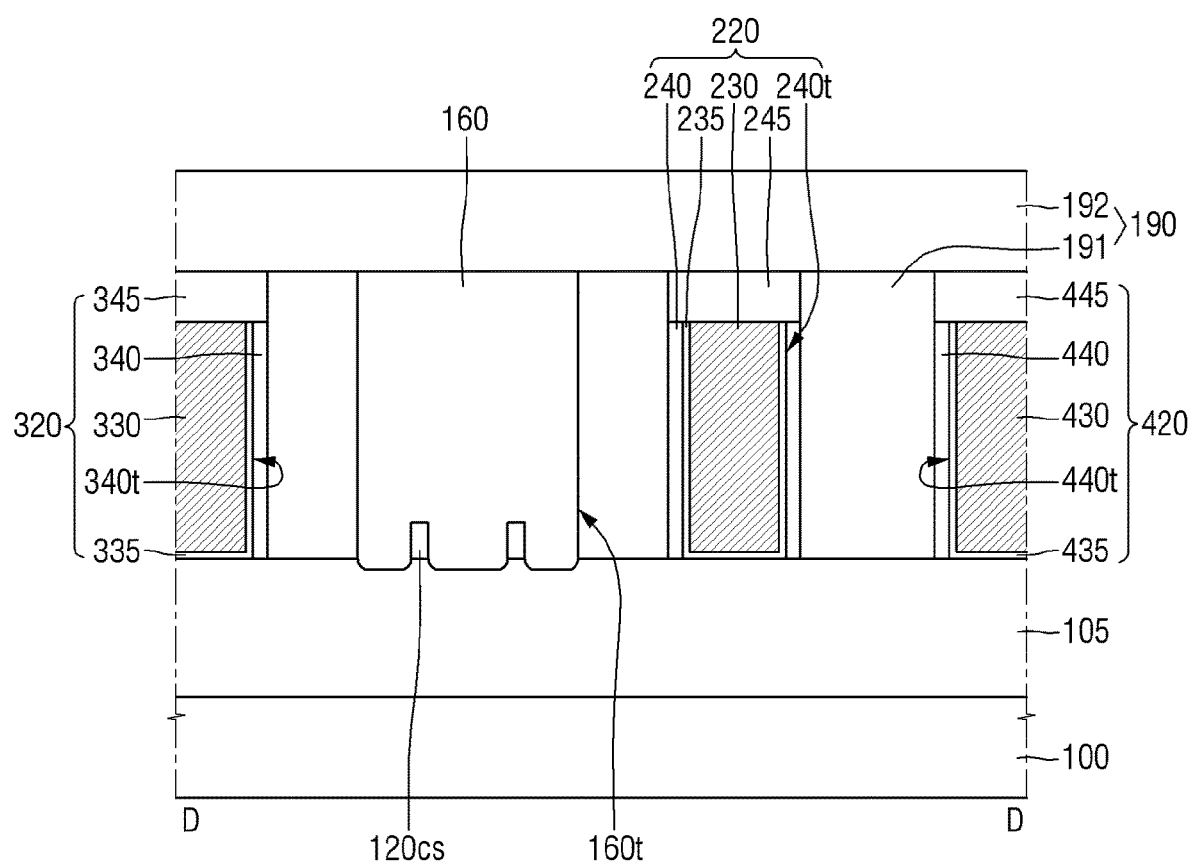
FIG. 10 illustrates a semiconductor device according to embodiments.
Figure 11:
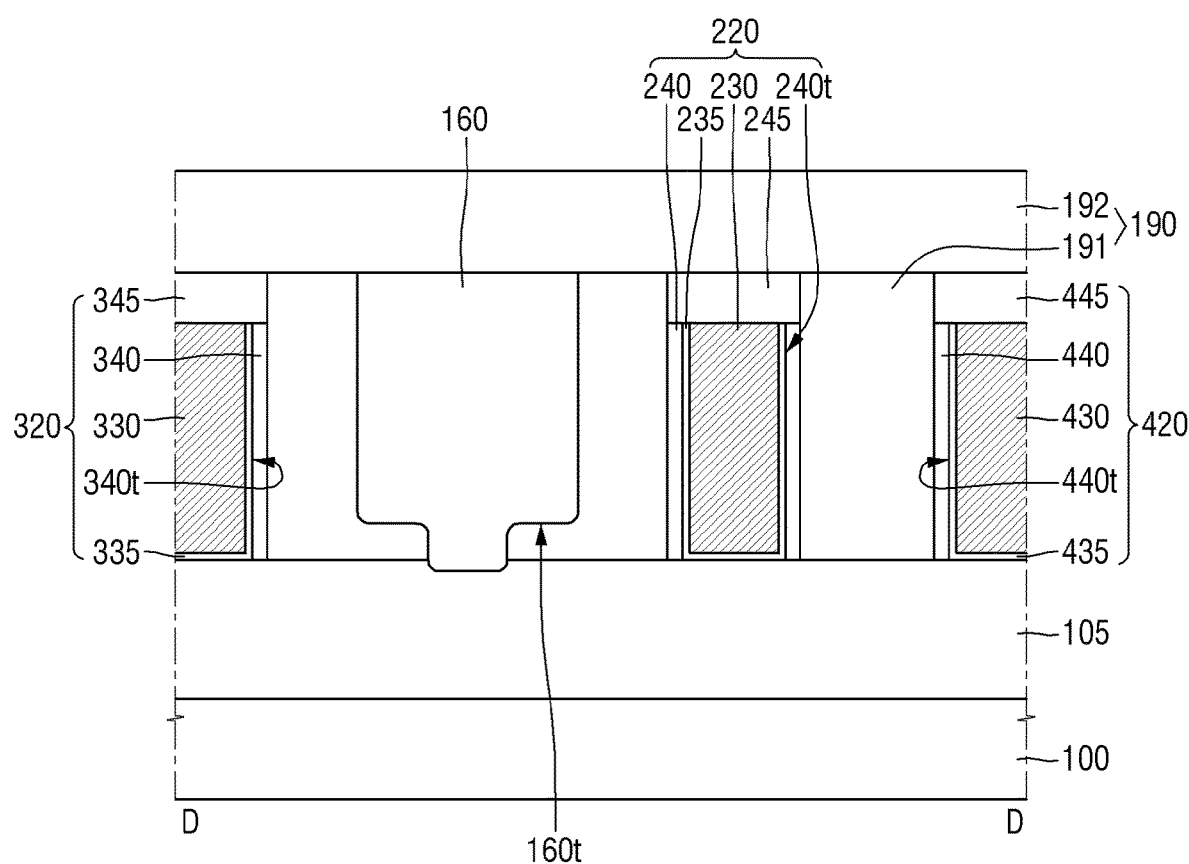
FIG. 11 illustrates a semiconductor device according to embodiments.

FIG. 10 illustrates a semiconductor device according to embodiments. FIG. 11 illustrates a semiconductor device according to embodiments. For ease of description, the following embodiments will be described, focusing mainly on differences from elements and features described above with reference to FIGS. 1 through 6.

Referring to FIG. 10, the semiconductor device according to the embodiments may further include connection spacers 120cs, which protrude from an upper surface of a field insulating layer 105, between a gate insulating support 160 and the field insulating layer 105.

The connection spacers 120cs may be recessed into the gate insulating support 160. For example, the height of the connection spacers 120cs in the second direction Y is smaller than the heights of the second through fourth gate spacers 240 through 440 in the second direction Y. Bottom surfaces of the connection spacers 120*cs* and bottom surfaces of the second through fourth gate spacers 240, 340, and 440 may contact the field insulating layer 105. Thus, upper surfaces of the second through fourth gate spacers 240, 340, and 440 are higher than upper surfaces of the connection spacers 120*cs*.

In addition, the connection spacers 120*cs* are directly connected to a first gate structure 120. The connection spacers 120*cs* are directly connected to first dummy spacers 185 disposed on sidewalls of a first element isolation structure 180. The connection spacers 120*cs* contact the first gate structure 120. The material composition of the connection spacers 120*cs* and the first gate spacers 140 may be the same.

A bottom surface of the gate insulating support 160 may be defined by the field insulating layer 105 and the connection spacers 120*cs*.

Referring to FIG. 11, in the semiconductor device according to the embodiments, a portion of a lower interlayer insulating film 191 may be interposed between a gate insulating support 160 and a field insulating layer 105.

A bottom surface of the gate insulating support 160 includes a first portion defined by the field insulating layer 105 and second portions defined by the lower interlayer insulating film 191. The second portions of the gate insulating support 160 may be disposed in the first direction X with the first portion of the gate insulating support 160 interposed between the second portions.

The gate insulating support 160 whose bottom surface is defined by the field insulating layer 105 may contact the field insulating layer 105. The gate insulating support 160 whose bottom surface is defined by the lower interlayer insulating film 191 may not contact the field insulating layer 105.

Figure 12:
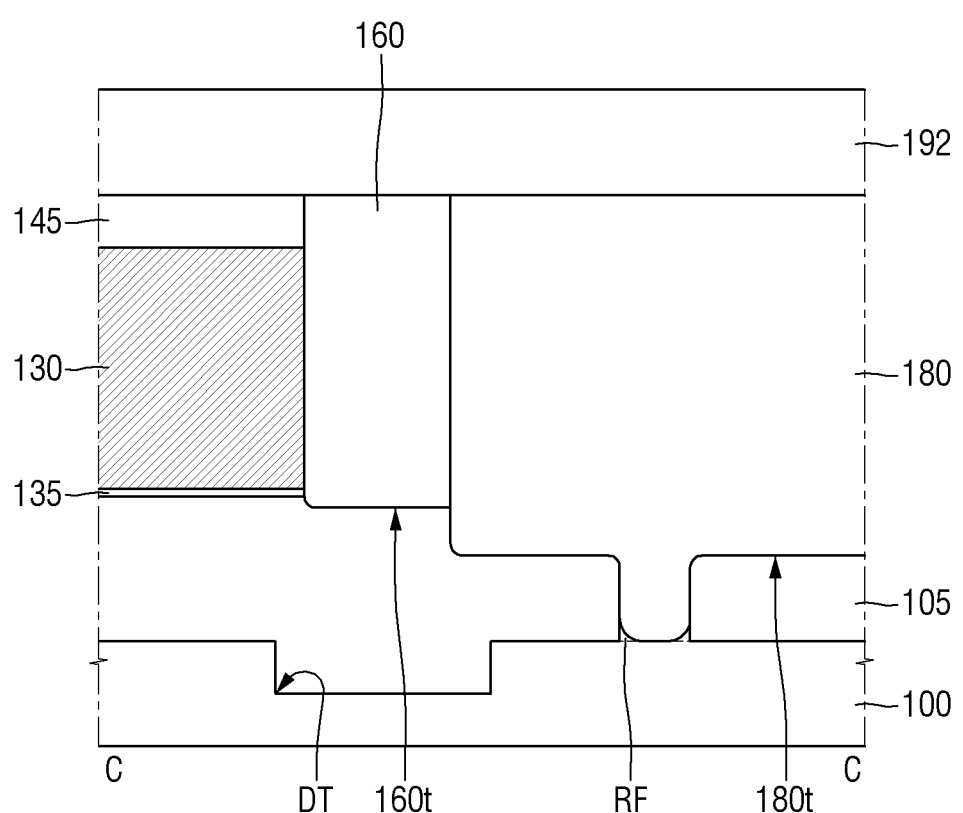
FIGS. 12 and 13 illustrate a semiconductor device according to embodiments.
Figure 13:
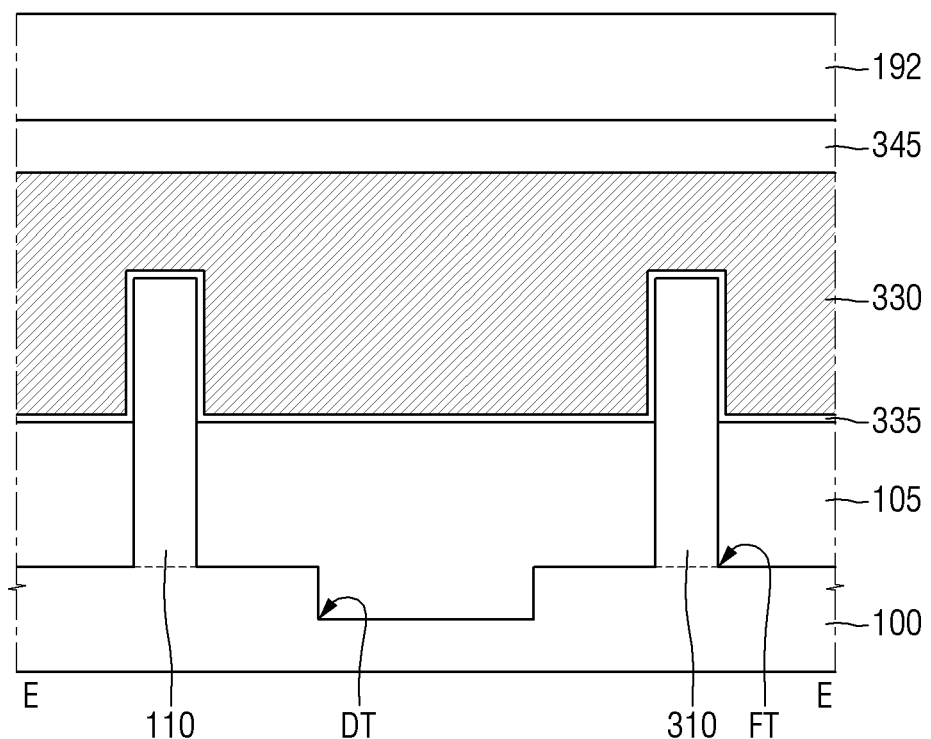
Figure 14:
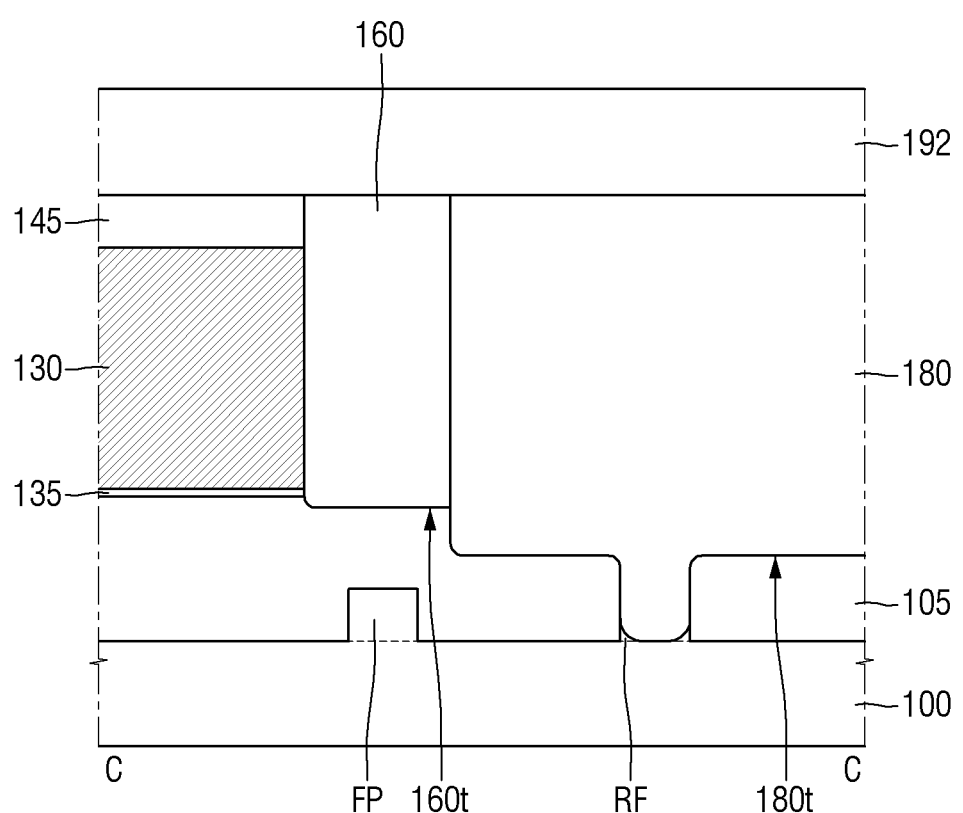
FIGS. 14 and 15 illustrate a semiconductor device according to embodiments.
Figure 15:
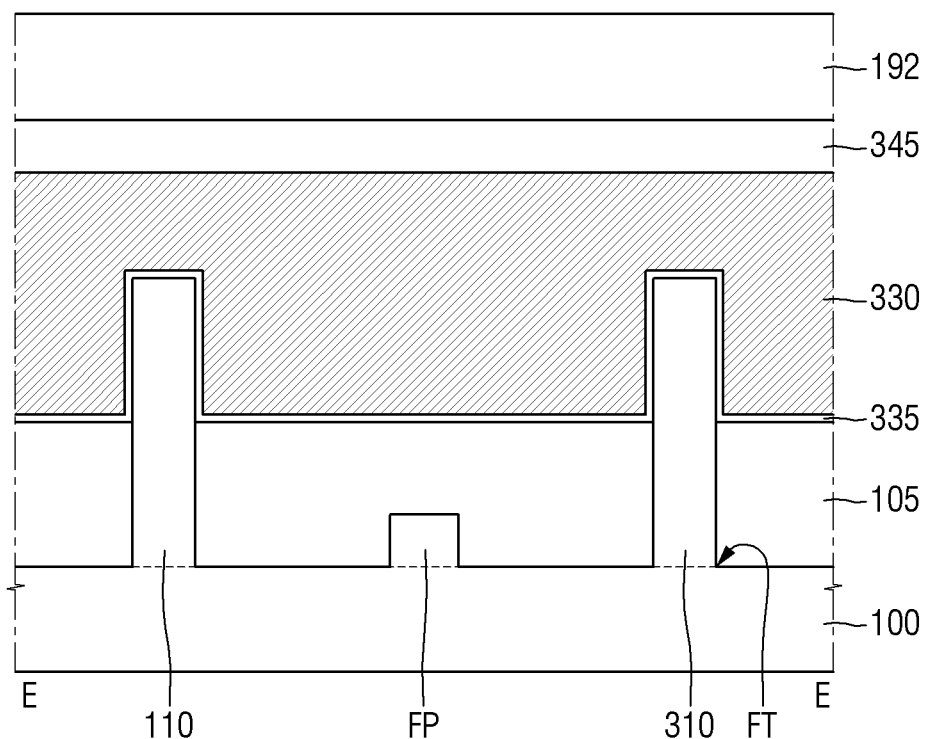

FIGS. 12 and 13 illustrate a semiconductor device according to embodiments. FIGS. 14 and 15 illustrate a semiconductor device according to embodiments. For ease of description, the following embodiments will be described, focusing mainly on differences from elements and features described above with reference to FIGS. 1 through 6.

Referring to FIGS. 12 and 13, a deep trench DT may be formed in a substrate 100 between a first fin pattern 110 and a third fin pattern 310.

The deep trench DT may be deeper than a fin trench FT defining long sides 110*a* (see FIG. 1) of the first fin pattern 110 and long sides 310*a* (see FIG. 1) of the third fin pattern 310. A field insulating layer 105 fills the deep trench DT.

A gate insulating support 160 may be formed on the field insulating layer 105 filling the deep trench DT.

Referring to FIGS. 14 and 15, the semiconductor device according to the embodiments may further include a protruding pattern FP protruding from a substrate 100 between a first fin pattern 110 and a third fin pattern 310.

The height of the protruding pattern FP is smaller than the height of the first fin pattern 110 and the height of the third fin pattern 310. The height of the protruding pattern FP is smaller than the height of a portion of the field insulating layer 105 which is overlapped by a first gate electrode 130.

For example, an upper surface of the protruding pattern FP may be covered with the field insulating layer 105. The protruding pattern FP may extend, but not necessarily, in the first direction X (see FIG. 1).

Although a bottom surface of the gate insulating support 160 is illustrated as being higher than the upper surface of the protruding pattern FP, embodiments are not limited to this case. The gate insulating support 160 may also contact the protruding pattern FP. In this case, the upper surface of the protruding pattern FP is not covered with the field insulating layer 105.

Figure 16:
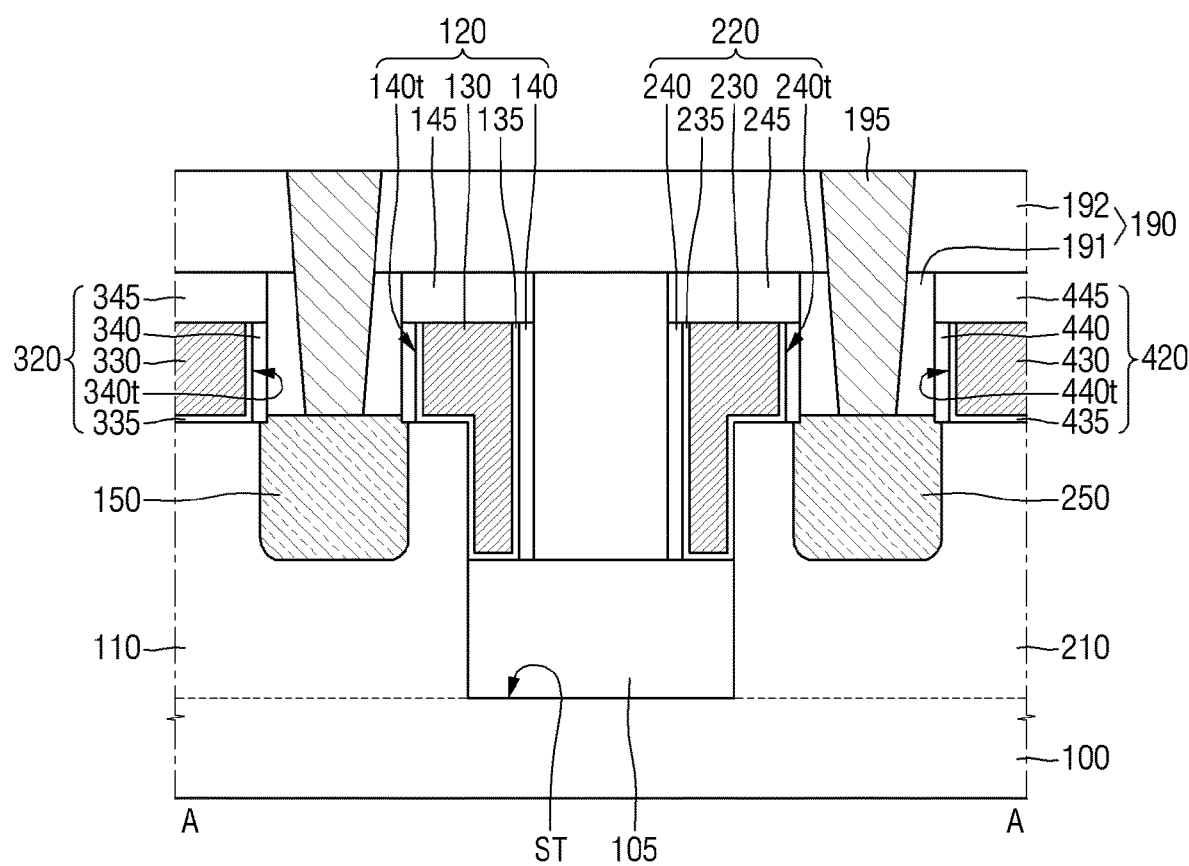
FIG. 16 illustrates a semiconductor device according to embodiments.
Figure 17:
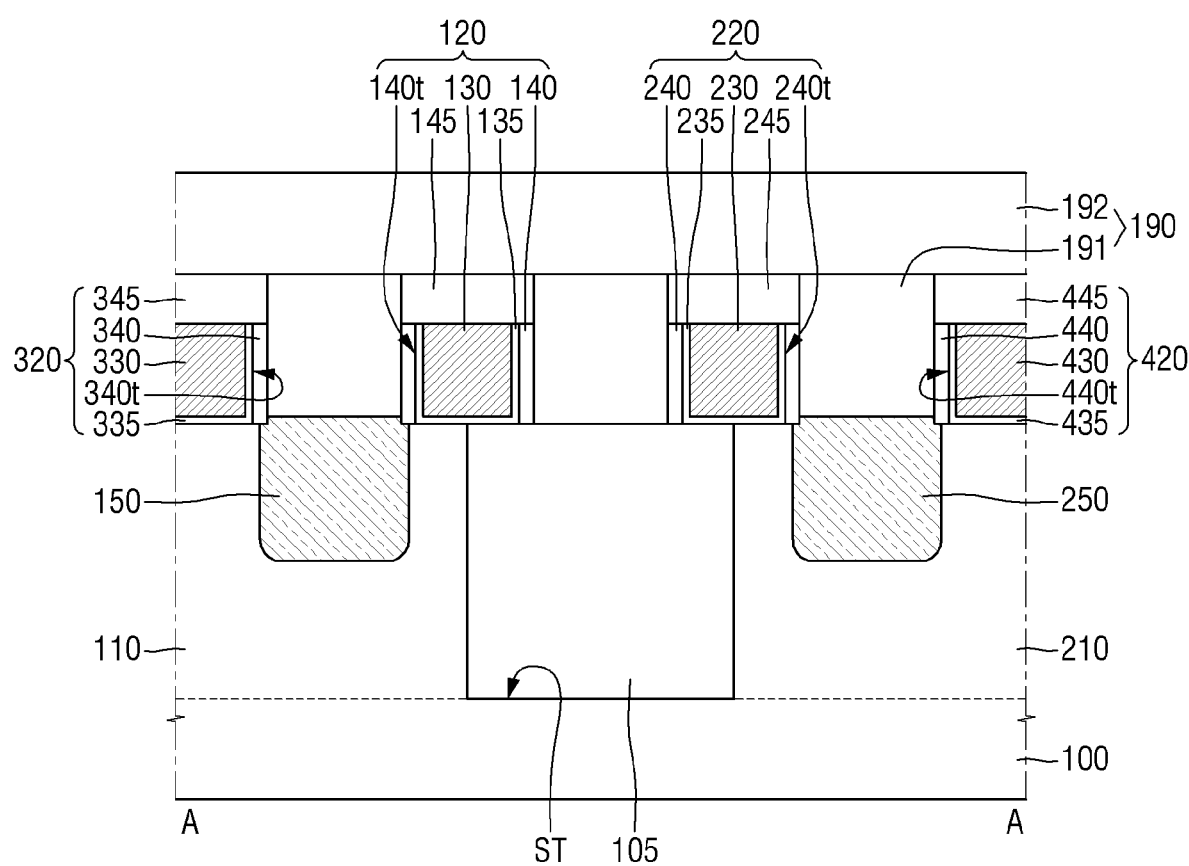
FIGS. 17 and 18 illustrate a semiconductor device according to embodiments.
Figure 18:
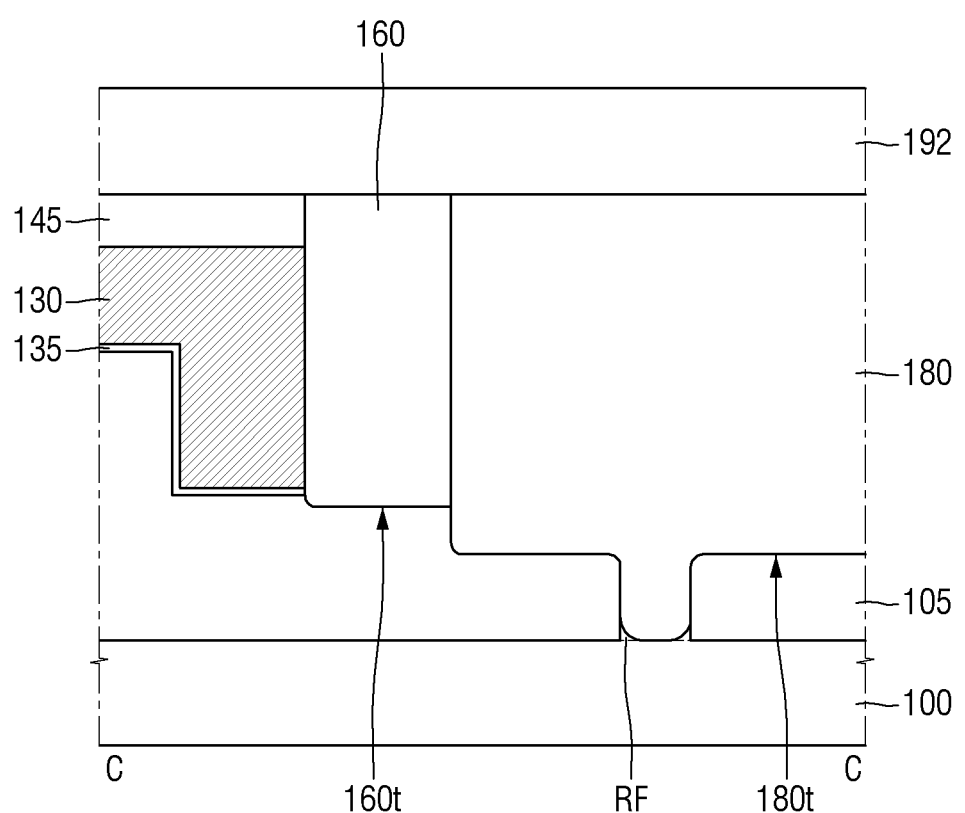

FIG. 16 illustrates a semiconductor device according to embodiments. FIGS. 17 and 18 illustrate a semiconductor device according to embodiments. For ease of description, the following embodiments will be described, focusing mainly on differences from elements and features described above with reference to FIGS. 1 through 6.

Referring to FIG. 16, the semiconductor device according to the embodiments may include contacts 195 penetrating an interlayer insulating film 190.

The contacts 195 may be connected to a first epitaxial pattern 150 and a second epitaxial pattern 250, respectively. Although the contacts 195 are illustrated as not contacting first through fourth gate structures 120, 220, 320, and 420, embodiments are not limited to this case.

Although each of the contacts 195 is illustrated as a single structure, embodiments are not limited to this case. Each of the contacts 195 may also include a plurality of structures arranged in a thickness direction of a substrate 100.

The contacts 195 may include at least one of, for example, tantalum (Ta), tantalum nitride (TaN), titanium (Ti), titanium nitride (TiN), tungsten nitride (WN), tungsten carbonitride (WCN), tungsten (W), cobalt (Co), ruthenium (Ru), molybdenum (Mo), nickel (Ni), aluminum (Al), copper (Cu) and doped polysilicon. Unlike in the drawing, a silicide layer may also be formed between the contacts 195 and the epitaxial patterns 150 and 250.

Referring to FIGS. 17 and 18, in the semiconductor device according to the embodiments, an upper surface of a field insulating layer 105 filling a fin-cut trench ST may be at the same height as or higher than an upper surface of a first fin pattern 110 and an upper surface of a second fin pattern 210.

Sidewalls of the first fin pattern 110 defining short sides 110*b* of the first fin pattern 110 and sidewalls of the second fin pattern 210 defining short sides 210*b* of the second fin pattern 210 may be covered with the field insulating layer 105.

For example, a first gate structure 120 does not cover the sidewalls of the first fin pattern 110 defining the short sides 110*b* (see FIG. 1) of the first fin pattern 110. A second gate structure 220 does not cover the sidewalls of the second fin pattern 210 defining the short sides 210*b* (see FIG. 1) of the second fin pattern 210.

Figure 19:
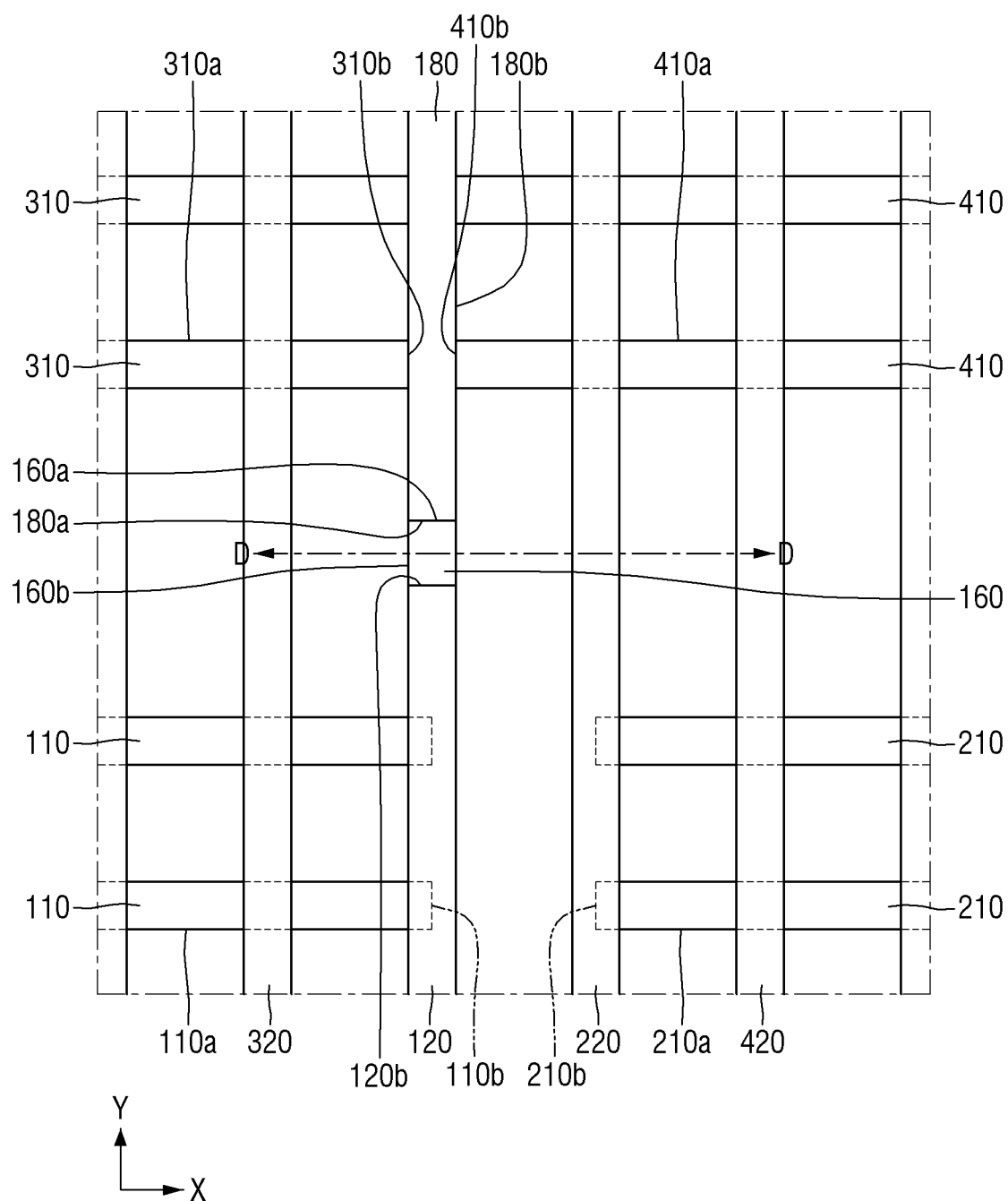
FIG. 19 is a schematic plan view of a semiconductor device according to embodiments.
Figure 20:
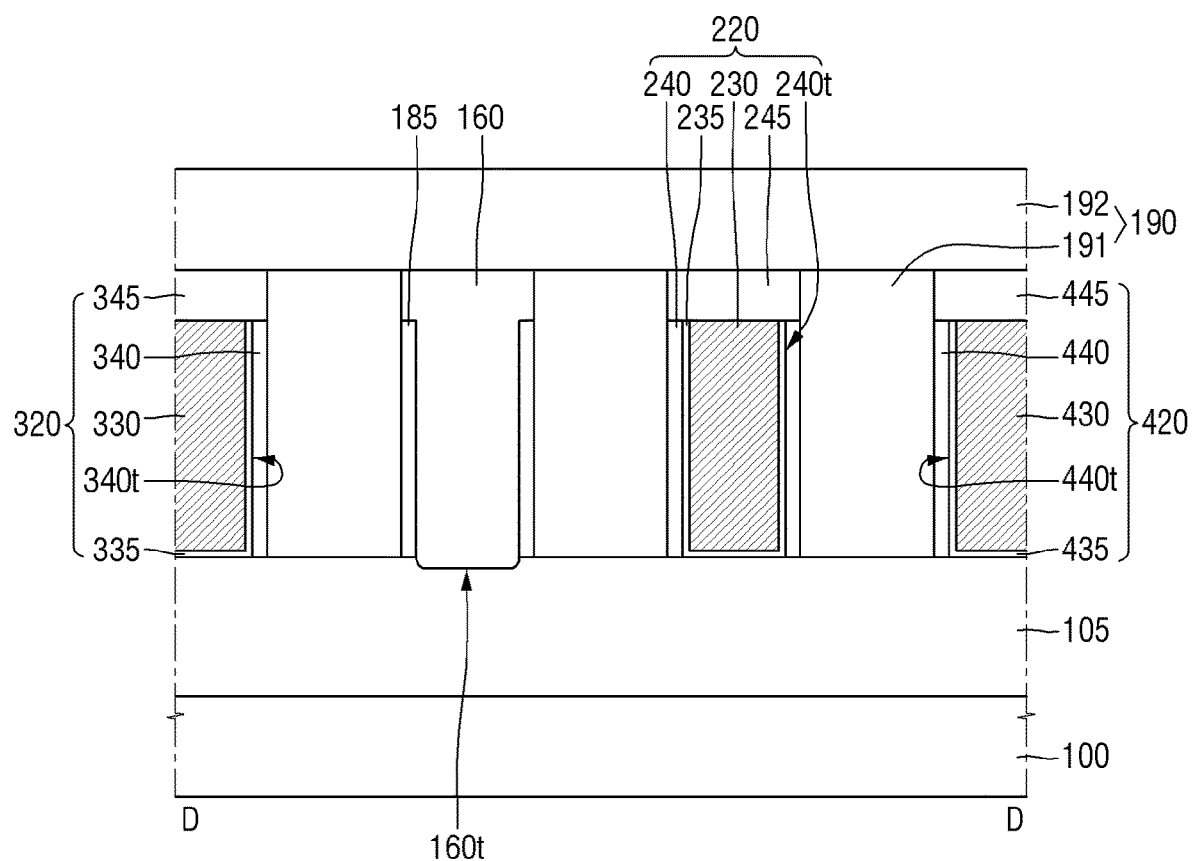
FIG. 20 is a cross-sectional view taken along line D-D of FIG. 19.

FIG. 19 is a schematic plan view of a semiconductor device according to embodiments. FIG. 20 is a cross-sectional view taken along line D-D of FIG. 19. For ease of description, the following embodiments will be described, focusing mainly on differences from elements and features described above with reference to FIGS. 1 through 6.

Referring to FIGS. 19 and 20, in the semiconductor device according to the embodiments, the width of a gate insulating support 160 in the first direction X may be smaller than or equal to the width of a first gate structure 120 in the first direction X.

The gate insulating support 160 may be formed between first dummy spacers 185. The first dummy spacers 185 may be disposed on sidewalls of the gate insulating support 160. The first dummy spacers 185 may extend along the sidewalls of the gate insulating support 160 and sidewalls of a first element isolation structure 180.

An insulating trench 160*t* may be aligned with the first dummy spacers 185. In the semiconductor device manufacturing process, the insulating trench 160*t* may be formed using the first dummy spacers 185 as a mask.

Figure 21:
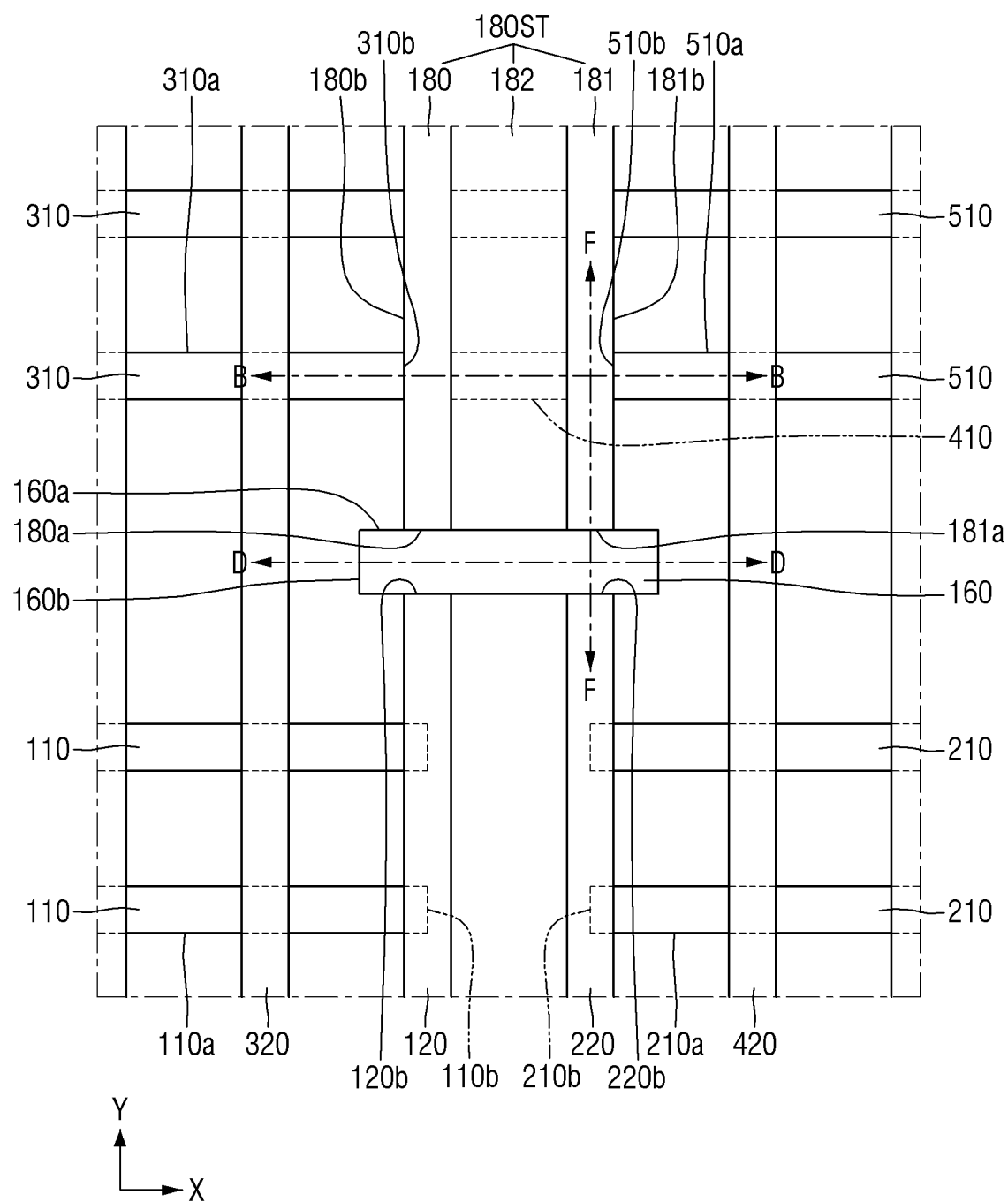
FIG. 21 is a schematic plan view of a semiconductor device according to embodiments.
Figure 22:
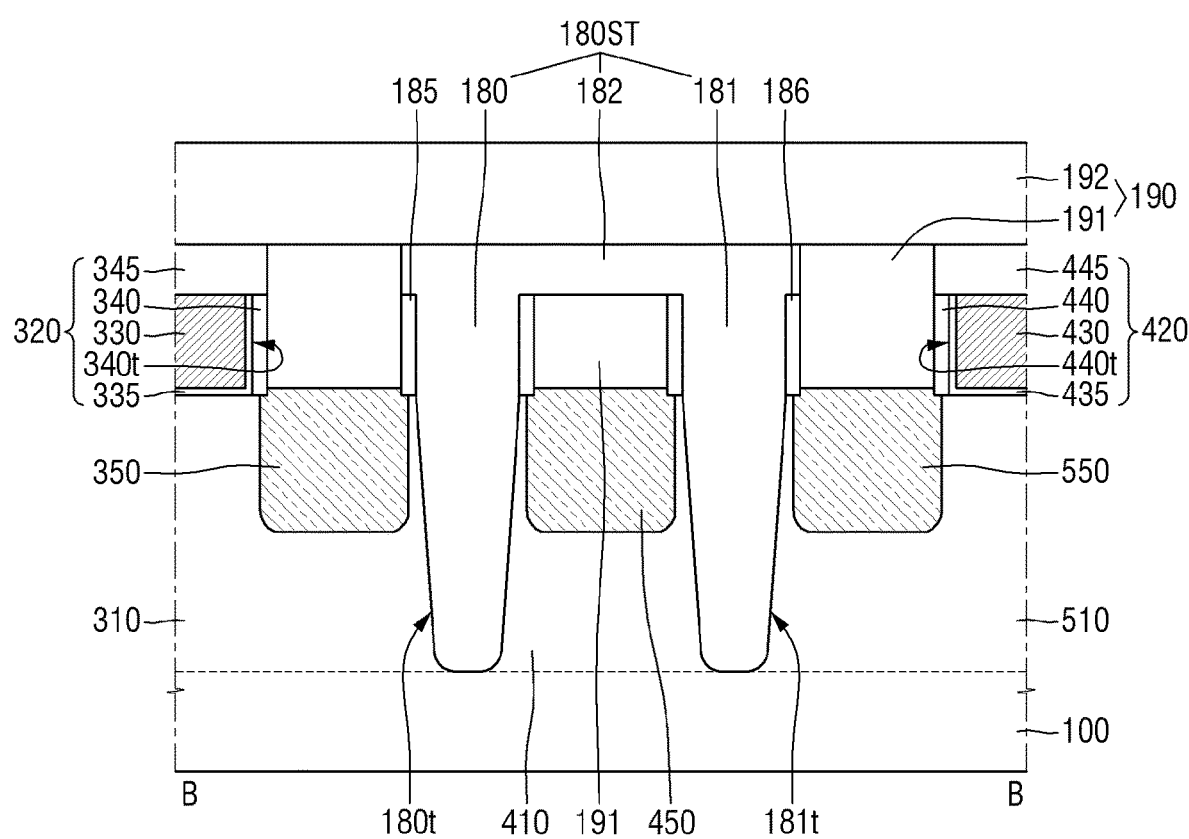
FIG. 22 is a cross-sectional view taken along line B-B of FIG. 21.
Figure 23:
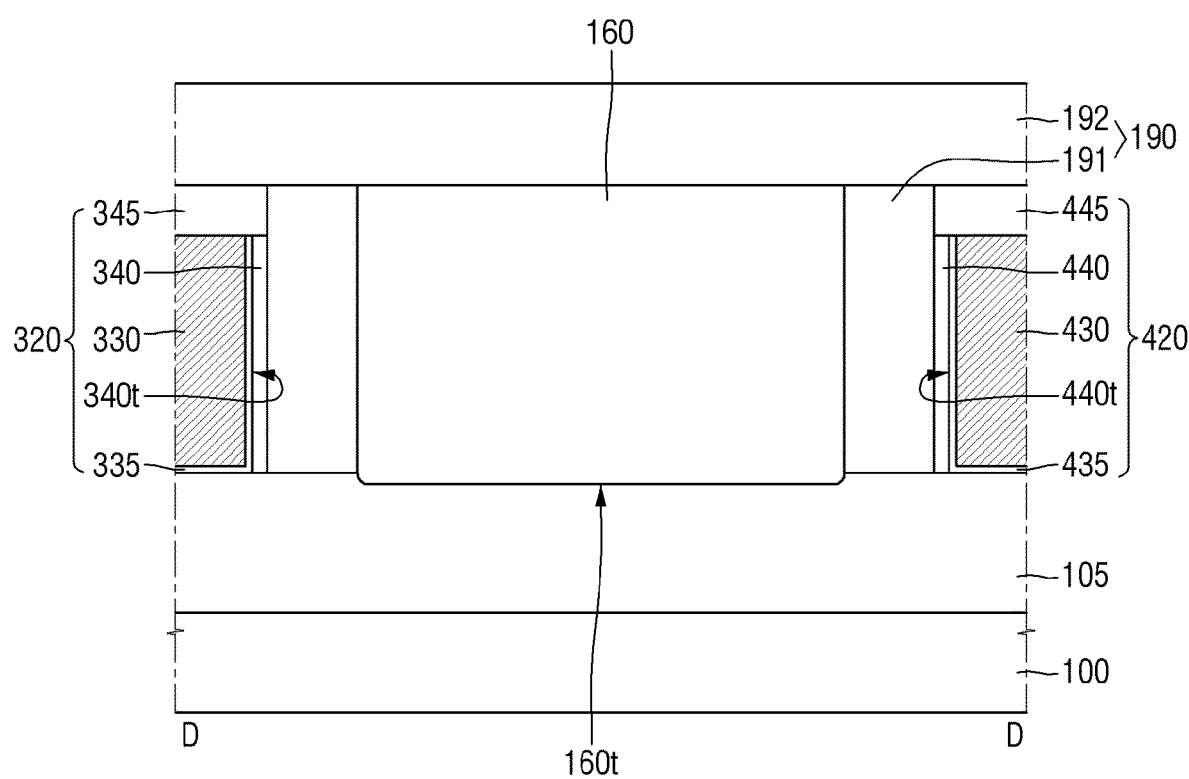
FIG. 23 is a cross-sectional view taken along line D-D of FIG. 21.
Figure 24:
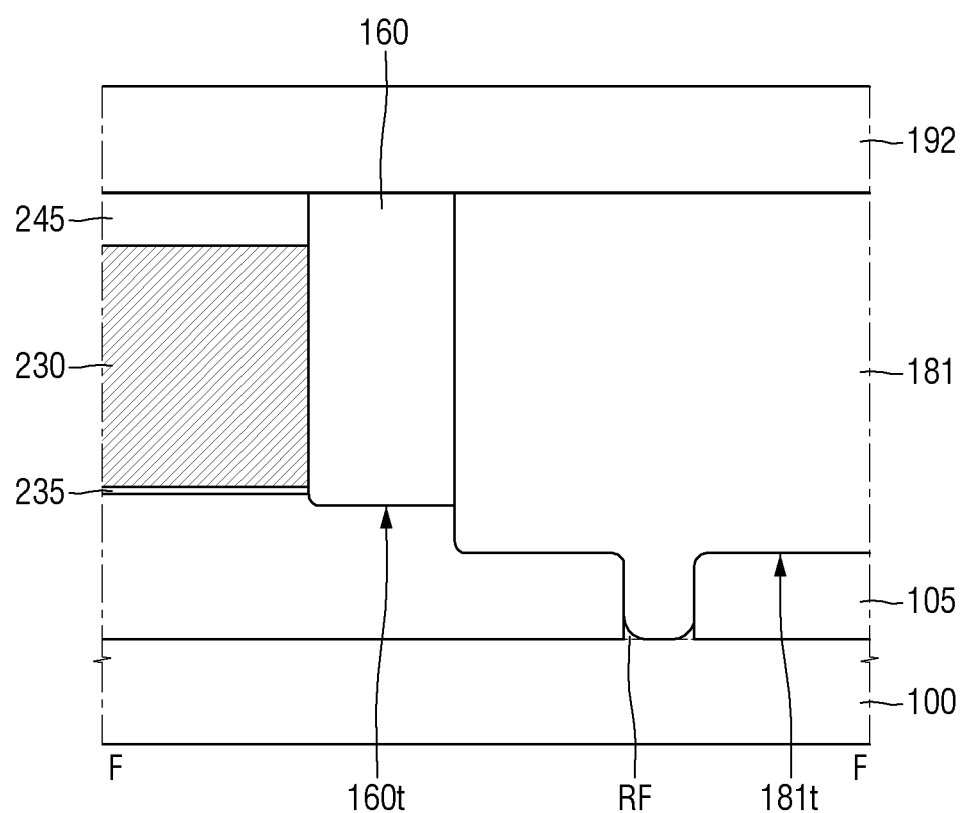
FIG. 24 is a cross-sectional view taken along line F-F of FIG. 21.

FIG. 21 is a schematic plan view of a semiconductor device according to embodiments. FIG. 22 is a cross-sectional view taken along line B-B of FIG. 21. FIG. 23 is a cross-sectional view taken along line D-D of FIG. 21. FIG. 24 is a cross-sectional view taken along line F-F of FIG. 21. For ease of description, the following embodiments will be described, focusing mainly on differences from elements and features described above with reference to FIGS. 1 through 6.

Referring to FIGS. 21 through 24, the semiconductor device according to the embodiments may further include fifth fin patterns 510, a second element isolation structure 181, and a connection isolation structure 182.

The fifth fin patterns 510 may protrude from a substrate 100. The fifth fin patterns 510 may extend on the substrate 100 along the first direction X. The fifth fin patterns 510 may include long sides 510a extending in the first direction X and short sides 510b extending in the second direction Y.

The fifth fin patterns 510 may be aligned with third and fourth fin patterns 310 and 410 in the first direction X which is a longitudinal direction. The third through fifth fin patterns 310 through 510 may be sequentially arranged in the first direction X. The fourth fin patterns 410 may be disposed between the third fin patterns 310 and the fifth fin patterns 510. The fourth fin patterns 410 and the fifth fin patterns 510 may be separated by a second isolation trench 181t. The third through fifth fin patterns 310 through 510 are disposed in a region in which transistors of the same conductivity type are formed.

A second gate structure 220 may intersect second fin patterns 210, but may not intersect the fourth and fifth fin patterns 410 and 510. The second gate structure 220 may extend up to a gate insulating support 160. A fourth gate structure 420 may be disposed on the second and fifth fin patterns 210 and 510 to intersect the second and fifth fin patterns 210 and 510.

A fourth epitaxial pattern 450 may be formed on each of the fourth fin patterns 410. A fifth epitaxial pattern 550 may be formed on each of the fifth fin patterns 510.

The second element isolation structure 181 may be disposed between the fourth and fifth fin patterns 410 and 510. The fourth fin patterns 410 may be disposed between a first element isolation structure 180 and the second element isolation structure 181. The second element isolation structure 181 may be disposed between the short sides of the fourth and fifth fin patterns 410 and 510.

The second element isolation structure 181 may separate the fourth fin patterns 410 and the fifth fin patterns 510. The first and second element isolation structures 180 and 181 may be disposed between a third gate structure 320 and the fourth gate structure 420.

The second element isolation structure 181 includes first sides 181a extending in the first direction X and second sides 181b extending in the second direction Y. A first side 181a of the second element isolation structure 181 may face a short side 220b of the second gate structure 220. The second sides 181b of the second element isolation structure 181 may face the short sides of the fourth and fifth fin patterns 410 and 510.

The second element isolation structure 181 and the second gate structure 220 may be aligned in the second direction Y. The second element isolation structure 181 is disposed on an extension line of the second gate structure 220 extending in the second direction Y.

The second element isolation structure 181 may be disposed in the second isolation trench 181t included in a lower interlayer insulating film 191. The second element isolation structure 181 may fill the second isolation trench 181t.

The second isolation trench 181t may be formed between the fourth epitaxial pattern 450 and the fifth epitaxial pattern 550. Sidewalls of the second isolation trench 181t extending in the second direction Y between the fourth epitaxial pattern 450 and the fifth epitaxial pattern 550 may be defined by second dummy spacers 186, the lower interlayer insulating film 191, and the fourth and fifth fin patterns 410 and 510.

An upper surface of the second element isolation structure 181 is higher than upper surfaces of the fourth and fifth fin patterns 410 and 510. For example, the upper surface of the second element isolation structure 181 may lie in the same plane as an upper surface of the lower interlayer insulating film 191.

The upper surface of the second element isolation structure 181 may lie in the same plane as upper surfaces of the third and fourth gate structures 320 and 420.

In FIG. 22, a width between the sidewalls of the second isolation trench 181t defined by the fourth and fifth fin patterns 410 and 510 increases as the distance from the substrate 100 increases. For example, a width between the sidewalls of the second isolation trench 181t defined by the fourth and fifth fin patterns 410 and 510 in the first direction X may gradually increase in the second direction Y as the distance from the substrate 100 increases. However, embodiments are not limited to this case. For example, a width between the sidewalls of the second isolation trench 181t defined by the fourth and fifth fin patterns 410 and 510 in the first direction X may remain the same as the distance from the substrate 100 increases in the second direction Y.

In FIG. 24, a part of sidewalls of the second isolation trench 181t extending in the first direction X may be defined by a field insulating layer 105. A portion of the second isolation trench 181t may be, but not necessarily, recessed into the field insulating layer 105.

A bottom surface of the second isolation trench 181t may be defined by the field insulating layer 105, the substrate 100, and a remaining fin RF. The remaining pin RF may be a portion remaining after a fin pattern portion is removed in an etching process for forming the second isolation trench 181t. The remaining fin RF may also not be present, unlike in the drawing.

In FIG. 24, the bottom surface of the second isolation trench 181t defined by the field insulating layer 105 is illustrated as being closer to the substrate 100 than a bottom surface of a first insulating trench 160t. However, embodiments are not limited to this case.

The second element isolation structure 181 may include at least one of, for example, silicon nitride, silicon oxide, silicon carbide, silicon carbonitride, silicon oxycarbide, silicon oxynitride, silicon oxycarbonitride, and aluminum oxide. Although the second element isolation structure 181 is illustrated as a single layer, this is merely an example used for ease of description, and the second element isolation structure 181 is not limited to a single layer.

The material composition of the second dummy spacers 186 and the second gate spacers 240 may be the same. Unlike in the drawings, the second dummy spacers 186 may not be disposed on sidewalls of the second element isolation structure 181.

The connection isolation structure 182 may be disposed between the first element isolation structure 180 and the second element isolation structure 181. The connection isolation structure 182 may connect the first element isolation structure 180 and the second element isolation structure 181. The second element isolation structure 181 may be connected to the first element isolation structure 180 by the connection isolation structure 182.

The connection isolation structure 182 may connect an upper portion of the first element isolation structure 180 and an upper portion of the second element isolation structure 181. An upper surface of the connection isolation structure 182 may lie in the same plane as upper surfaces of the first and second element isolation structures 180 and 181.

The connection isolation structure 182 may cover the fourth fin patterns 410 and the fourth epitaxial patterns 450. A portion of the lower interlayer insulating film 191 may be disposed between the connection isolation structure 182 and each of the fourth fin patterns 410.

For example, a portion of the lower interlayer insulating film 191 may be disposed between the connection isolation structure 182 and each fourth epitaxial pattern 450. For example, a lower surface of the connection isolation structure 182 is higher than the upper surfaces of the fourth fin patterns 410 and upper surfaces of the fourth epitaxial patterns 450 based on bottom surfaces of the first and second element isolation structures 180 and 181.

The first and second element isolation structures 180 and 181 and the connection isolation structure 182 may be included in an integrated isolation structure 180ST. For example, the first and second element isolation structures 180 and 181 and the connection isolation structure 182 may be formed in the same process to produce an integral structure.

The connection isolation structure 182 may include at least one of, for example, silicon nitride, silicon oxide, silicon carbide, silicon carbonitride, silicon oxycarbide, silicon oxynitride, silicon oxycarbonitride, and aluminum oxide.

The gate insulating support 160 may be disposed between a first gate structure 120 and the first element isolation structure 180 and between the second gate structure 220 and the second element isolation structure 181. The gate insulating support 160 may be disposed on a field insulating layer 105 between the first gate structure 120 and the first element isolation structure 180 and between the second gate structure 220 and the second element isolation structure 181.

The gate insulating support 160 may separate the second gate structure 220 and the second element isolation structure 181. The gate insulating support 160 may cross between the second gate structure 220 and the second element isolation structure 181.

The second gate structure 220 and the second element isolation structure 181 may be arranged in the second direction Y with the gate insulating support 160 interposed between them.

The gate insulating support 160 contacts the second gate structure 220 and the second element isolation structure 181. The gate insulating support 160 may contact the connection isolation structure 182.

The gate insulating support 160 includes first sides 160a extending in the first direction X and second sides 160b extending in the second direction Y. The second gate structure 220 and the second element isolation structure 181 contact the first sides 160a of the gate insulating support 160. The connection isolation structure 182 may contact a first side 160a of the gate insulating support 160.

In the semiconductor device according to the embodiments, the width of the gate insulating support 160 in the first direction X is greater than the width of the first gate structure 120 in the first direction X and the width of the second gate structure 220 in the first direction X. Although the gate insulating support 160 is illustrated as not contacting the third and fourth gate structures 320 and 420 in FIG. 23, embodiments are not limited to this case.

Figure 25:
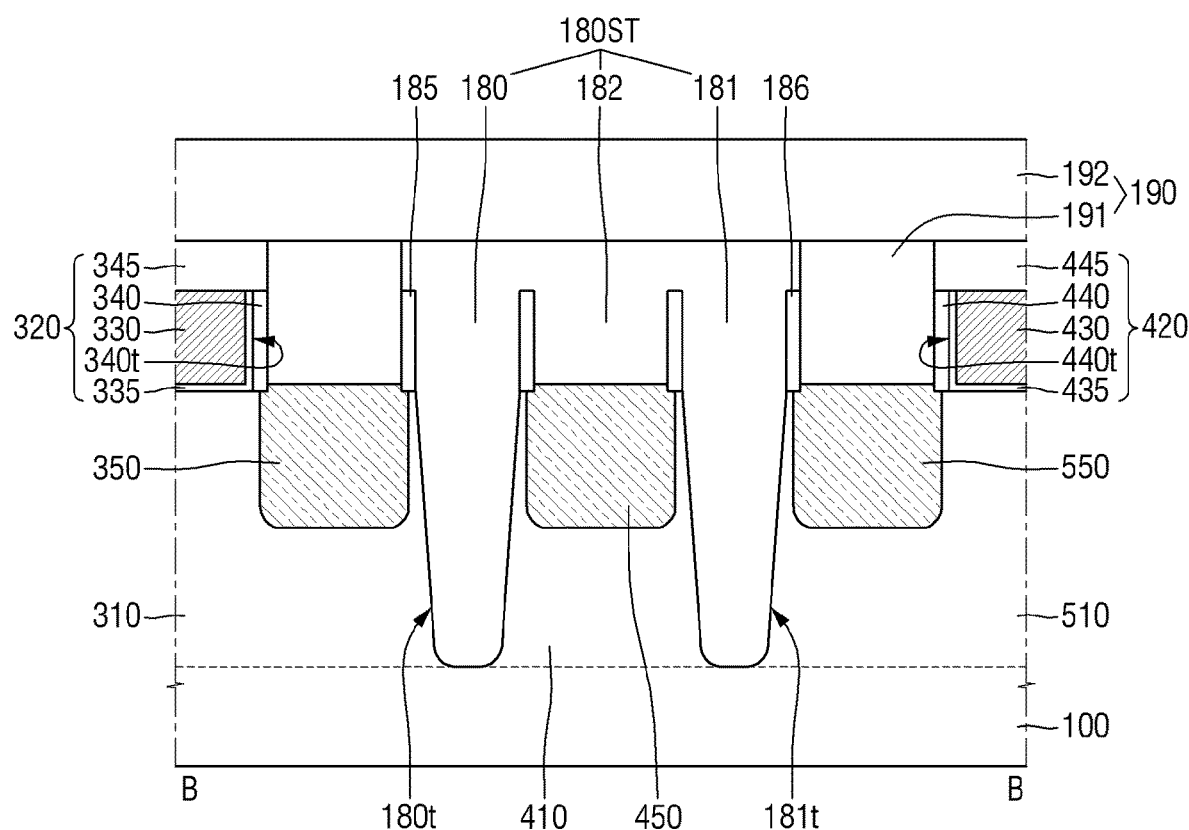
FIG. 25 illustrates a semiconductor device according to embodiments.
Figure 26:
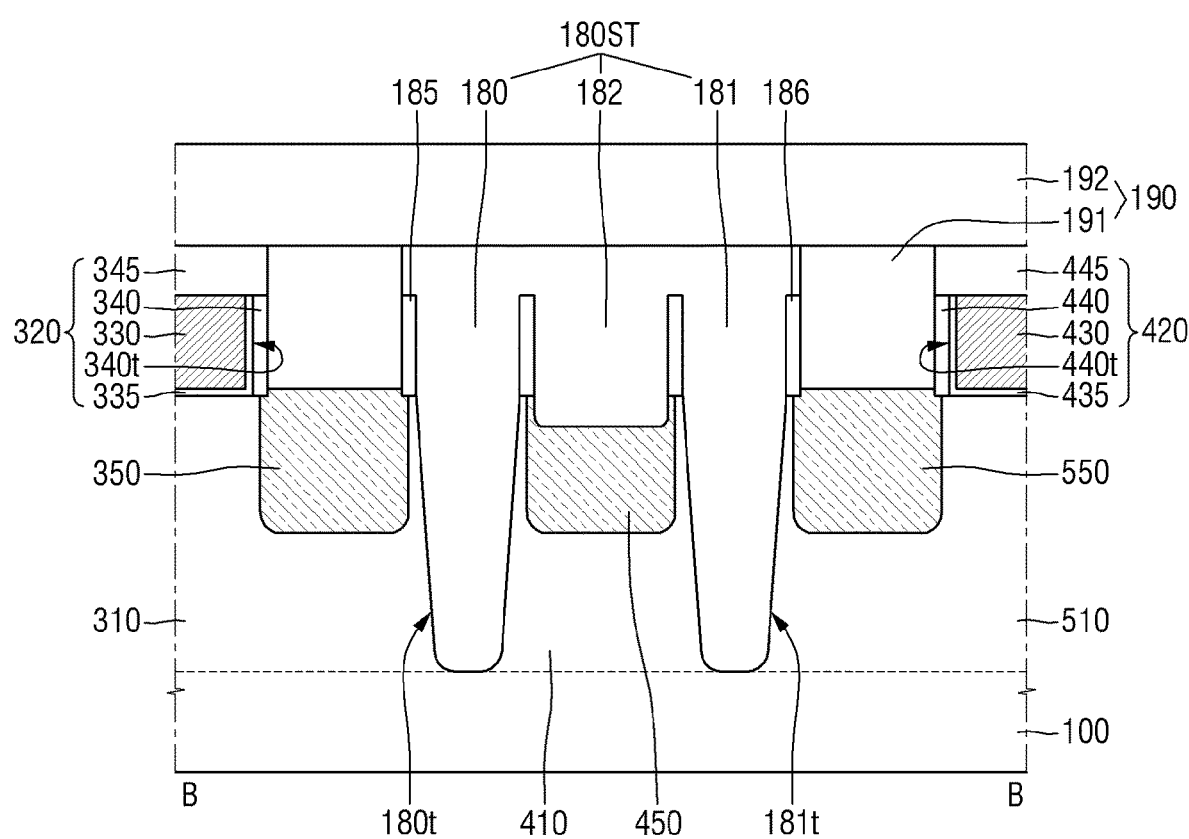
FIG. 26 illustrates a semiconductor device according to embodiments.

FIG. 25 illustrates a semiconductor device according to embodiments. FIG. 26 illustrates a semiconductor device according to embodiments. For ease of description, the following embodiments will be described, focusing mainly on differences from elements and features described above with reference to FIGS. 21 through 24.

Referring to FIG. 25, in the semiconductor device according to the embodiments, a connection isolation structure 182 may contact a fourth epitaxial pattern 450.

In an etching process for forming the connection isolation structure 182, an upper surface of the fourth epitaxial pattern 450 may be exposed. The connection isolation structure 182 may be formed on the exposed fourth epitaxial pattern 450.

Referring to FIG. 26, in the semiconductor device according to the embodiments, a portion of a connection isolation structure 182 may be recessed into a fourth epitaxial pattern 450.

In an etching process for forming the connection isolation structure 182, a portion of the fourth epitaxial pattern 450 may be etched. The connection isolation structure 182 may be formed on the partially etched fourth epitaxial pattern 450.

Figure 27:
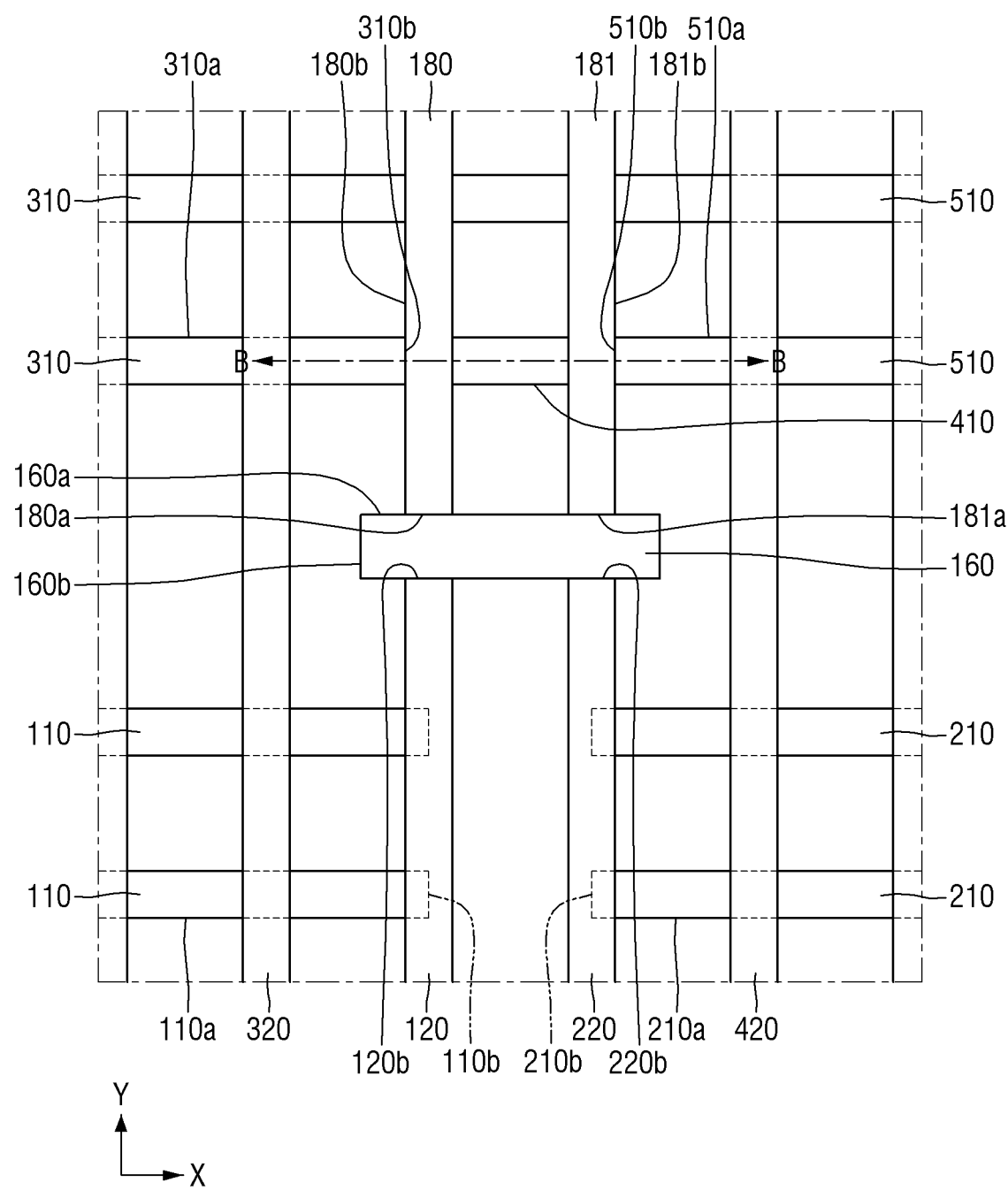
FIG. 27 is a schematic plan view of a semiconductor device according to embodiments.
Figure 28:
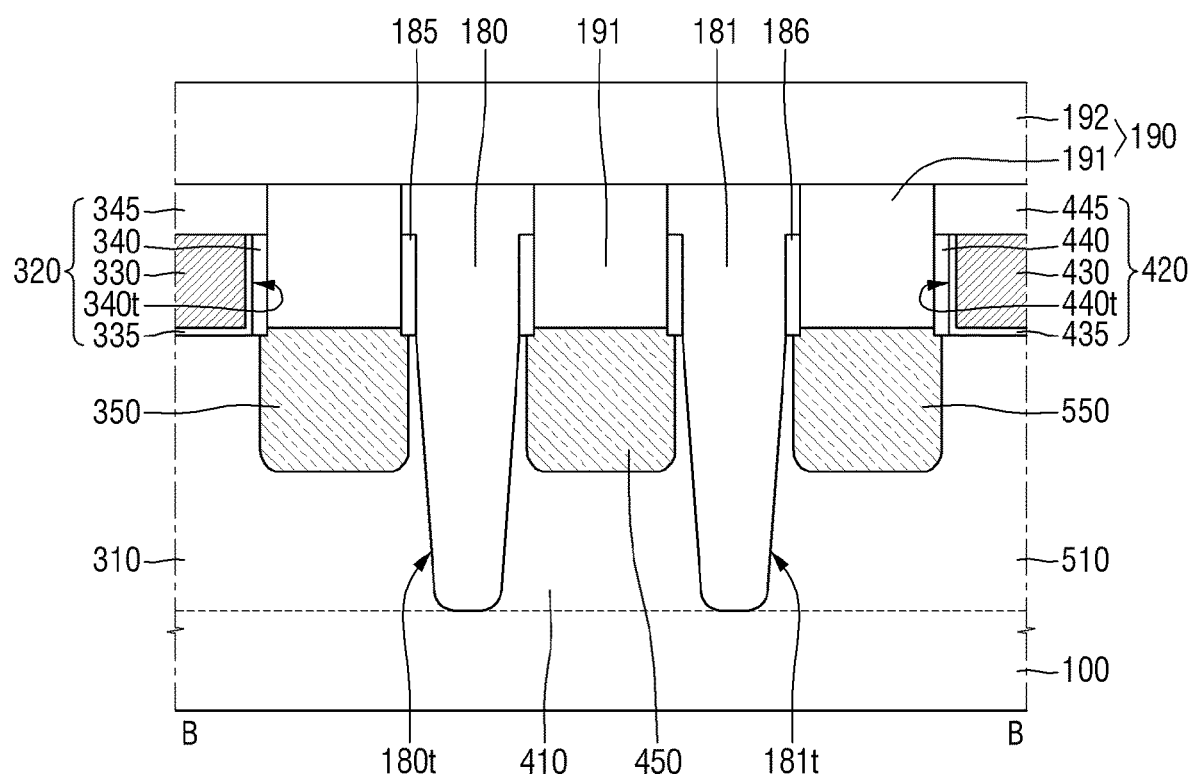
FIG. 28 is a cross-sectional view taken along line B-B of FIG. 27.

FIG. 27 is a schematic plan view of a semiconductor device according to embodiments. FIG. 28 is a cross-sectional view taken along line B-B of FIG. 27. For ease of description, the following embodiments will be described, focusing mainly on differences from elements and features described above with reference to FIGS. 21 through 24.

Referring to FIGS. 27 and 28, in the semiconductor device according to the embodiments, a first element isolation structure 180 is separated from a second element isolation structure 181.

A connection isolation structure for connecting the first element isolation structure 180 and the second element isolation structure 181 is not disposed between the first element isolation structure 180 and the second element isolation structure 181.

The connection isolation structure for connecting the first element isolation structure 180 and the second element isolation structure 181 is not disposed on fourth fin patterns 410 and fourth epitaxial patterns 450.

Figure 29:
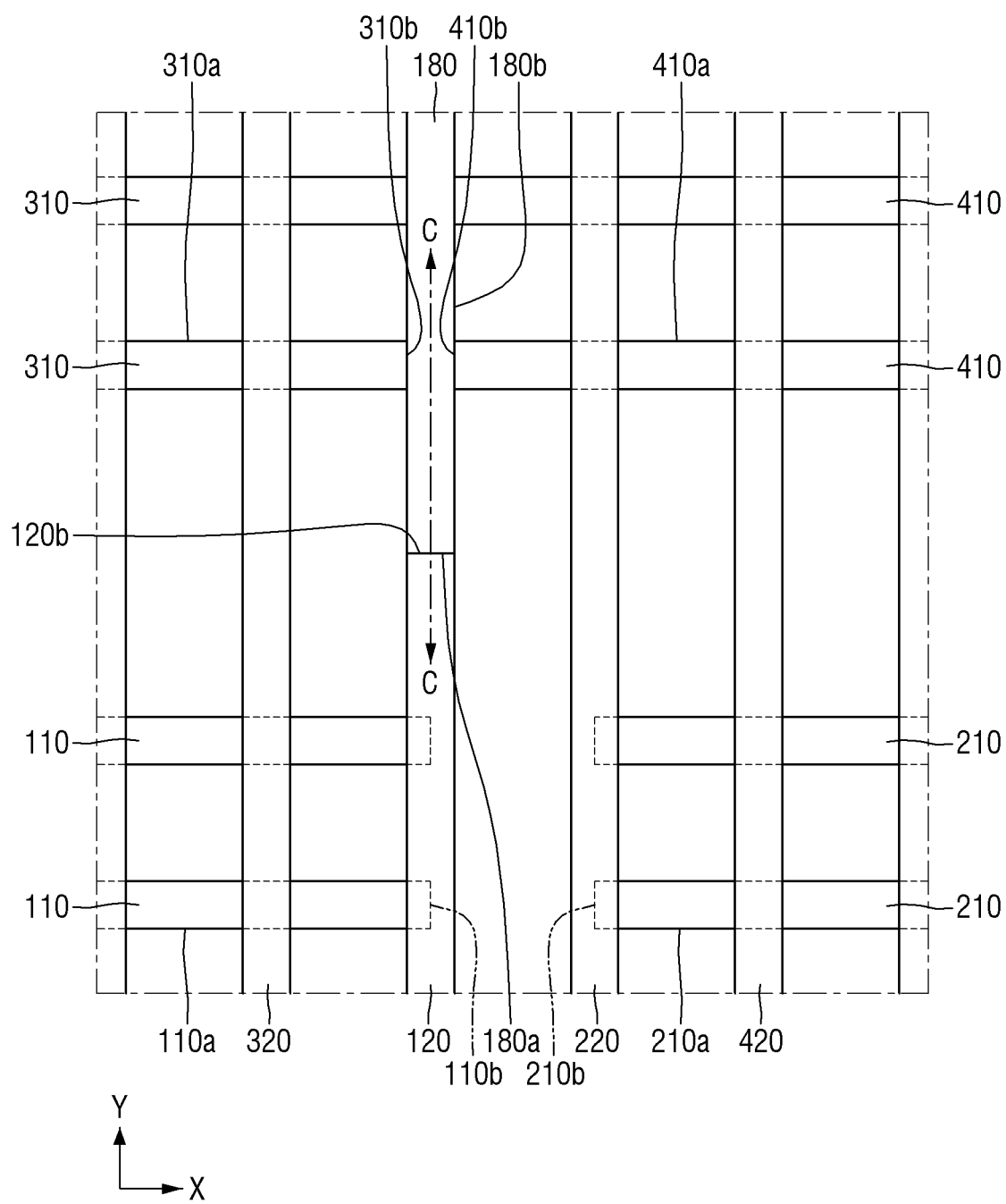
FIG. 29 is a schematic plan view of a semiconductor device according to embodiments.
Figure 30:
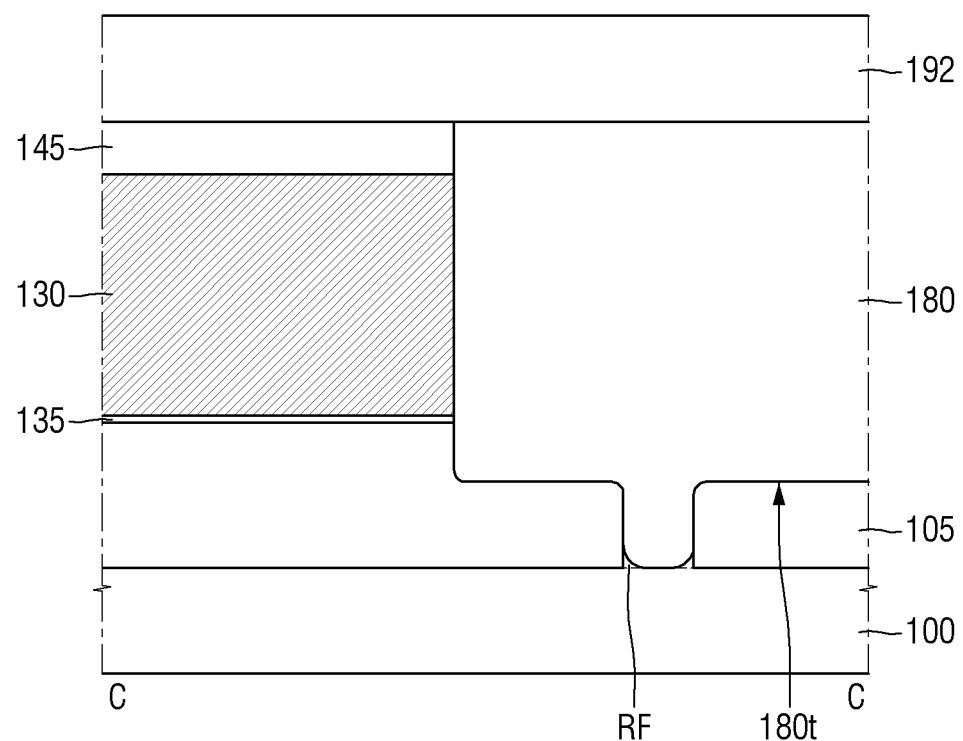
FIG. 30 is a cross-sectional view taken along line C-C of FIG. 29.

FIG. 29 is a schematic plan view of a semiconductor device according to embodiments. FIG. 30 is a cross-sectional view taken along line C-C of FIG. 29. For ease of description, the following embodiments will be described, focusing mainly on differences from elements and features described above with reference to FIGS. 1 through 6.

Referring to FIGS. 29 and 30, in the semiconductor device according to the embodiments, a first gate structure 120 may contact a first element isolation structure 180.

A short side 120b of the first gate structure 120 may contact a second side 180b of the first element isolation structure 180. The first gate structure 120 and the first element isolation structure 180 that are in contact with each other may be aligned in a line along the second direction Y.

A first gate electrode 130, a first gate insulating layer 135, and a first capping pattern 145 may be in contact with the first element isolation structure 180.

FIGS. 31 through 34 are views for explaining steps of a method of manufacturing a semiconductor device according to embodiments.

Figure 31:
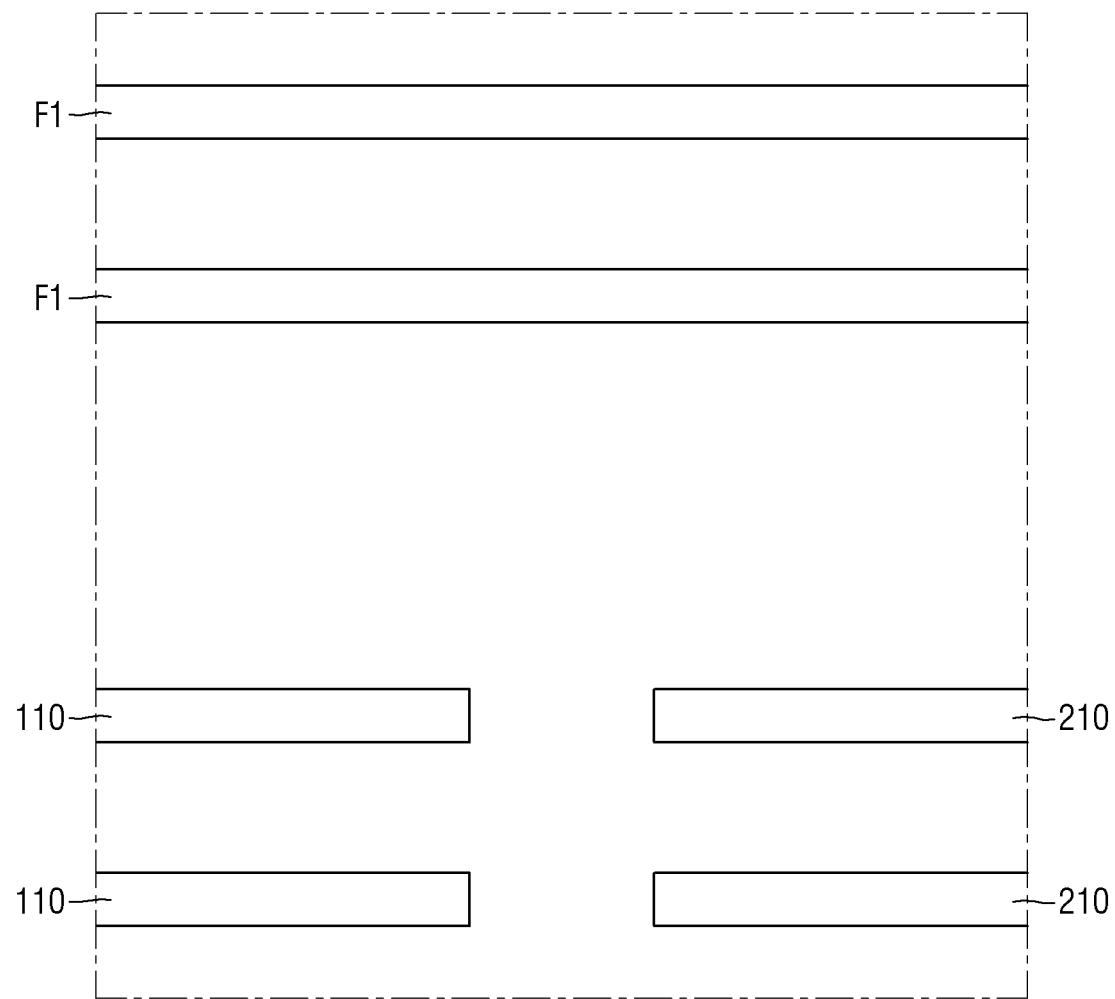
FIGS. 31 through 34 are views for explaining steps of a method of manufacturing a semiconductor device according to embodiments.

Referring to FIG. 31, first fin patterns 110 and second fin patterns 210 aligned in the first direction X are formed. The first fin patterns 110 and the second fin patterns 210 are spaced apart from each other in the first direction X.

Pre-fins F1 extending in the first direction X are formed. The pre-fins F1 are spaced apart from the first fin patterns 110 and the second fin patterns 210 in the second direction Y.

Figure 32:
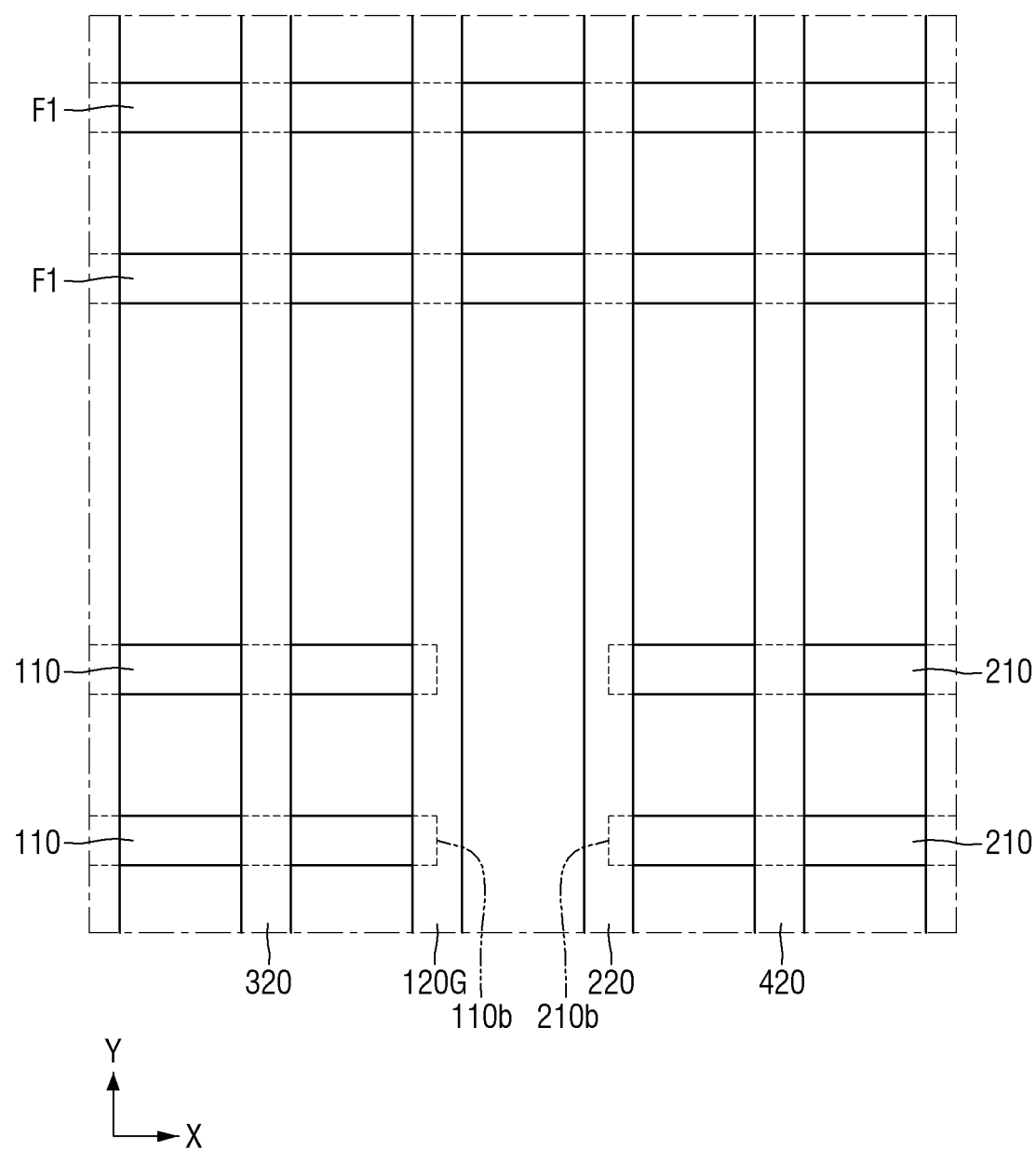

Referring to FIG. 32, a pre-gate structure 120G and a third gate structure 320 are formed on the first fin patterns 110 and the pre-fins F1.

Each of the pre-gate structure 120G and the third gate structure 320 intersects the first fin patterns 110 and the pre-fins F1. The pre-gate structure 120G overlaps ends of the first fin patterns 110 including short sides 110b of the first fin patterns 110. The third gate structure 320 does not overlap the ends of the first fin patterns 110.

A second gate structure 220 and a fourth gate structure 420 are formed on the second fin patterns 210 and the pre-fins F1.

Each of the second gate structure 220 and the fourth gate structure 420 intersects the second fin patterns 210 and the pre-fins F1. The second gate structure 220 overlaps ends of the second fin patterns 210 including short sides 210b of the second fin patterns 210. The fourth gate structure 420 does not overlap the ends of the second fin patterns 210.

In an example, the pre-gate structure 120G may include a gate electrode formed by a replacement metal gate (RMG) process. In another example, the pre-gate structure 120G may include a dummy mold gate prior to the RMG process.

In the method of manufacturing a semiconductor device according to the embodiments, the pre-gate structure 120G is described as including the gate electrode formed by the RMG process.

Figure 33:
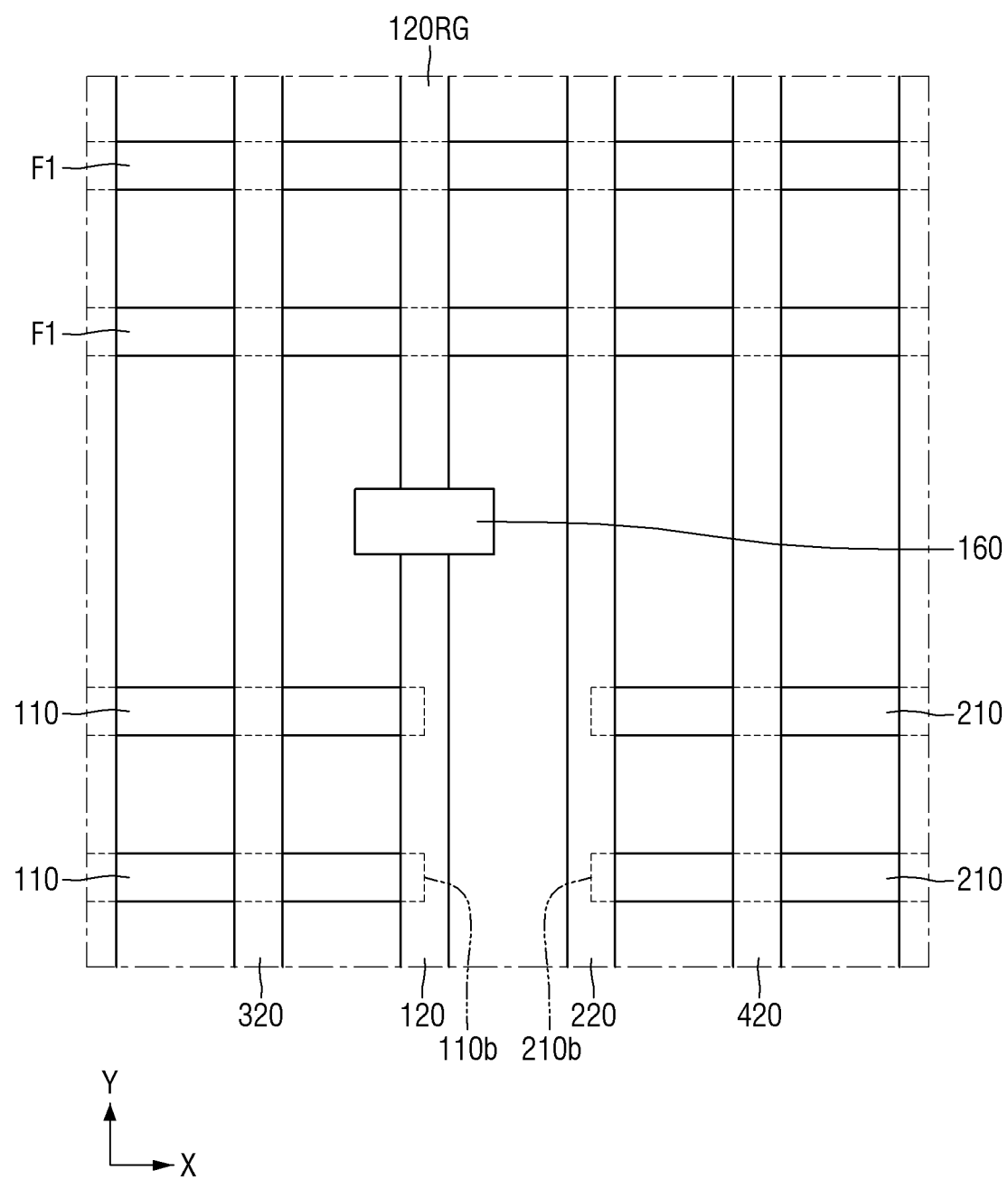

Referring to FIG. 33, a gate insulating support 160 for cutting the pre-gate structure 120G is formed.

The gate insulating support 160 may separate the pre-gate structure 120G into a first gate structure 120 and a fifth gate structure 120RG.

The first gate structure 120 intersects the first fin patterns 110. The fifth gate structure 120RG intersects the pre-fins F1.

Figure 34:
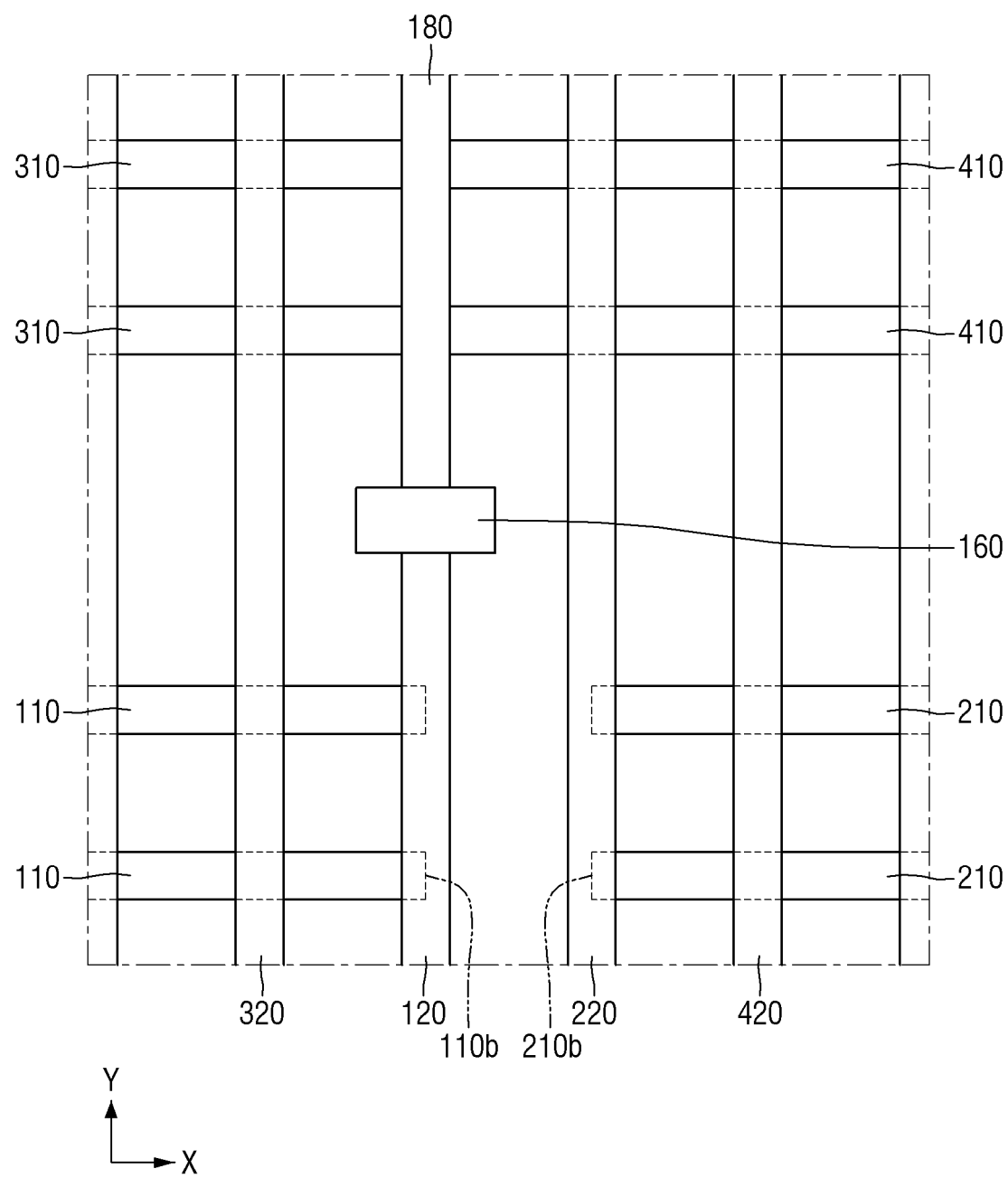

Referring to FIG. 34, the fifth gate structure 120RG and the pre-fins F1 may be partially removed.

As a result of the partial removal of the pre-fins F1, the pre-fins F1 may be separated into third fin patterns 310 and fourth fin patterns 410.

A first element isolation structure 180 may be formed at a position from which the fifth gate structure 120RG and the pre-fins F1 have been removed.

The gate insulating structure 160 may contact the first element isolation structure 180 and the first gate structure 120.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
   a first fin pattern and a second fin pattern which are separated by a first isolation trench and extend in a first direction,
   wherein a short side of the first fin pattern and a short side of the second fin pattern are spaced apart from each other in the first direction and face each other in the first direction;
   a third fin pattern which is spaced apart from the first fin pattern in a second direction intersecting the first direction and extends in the first direction;
   a fourth fin pattern which is separated from the third fin pattern by a second isolation trench,
   wherein a short side of the third fin pattern and a short side of the fourth fin pattern are spaced apart from each other in the first direction and face each other in the first direction, and
   wherein the second isolation trench extends in the second direction;
   a first gate structure which intersects the first fin pattern and has a portion extending along an upper surface of the first fin pattern;
   a second gate structure which intersects the second fin pattern and has a portion extending along an upper surface of the second fin pattern,
   wherein the first gate structure and the second gate structure are spaced apart from each other in the first direction, and
   wherein each of the first gate structure and the second gate structure extends in the second direction; and
   a first element isolation structure which fills the second isolation trench,
   wherein the first element isolation structure extends in the second direction,
   wherein a short side of the first element isolation structure and the short side of the first gate structure, in a top down view, are spaced apart from each other in the second direction and face each other in the second direction, and
   wherein the topmost surface of the first element isolation structure is at the same height as the topmost surface of the first gate structure.

2. The semiconductor device of claim 1, further comprising:
   a field insulating layer which is disposed between the first fin pattern and the third fin pattern; and
   a gate insulating support which is formed on an upper surface of the field insulating layer, and which is disposed, in the top down view, between the first element isolation structure and the first gate structure to contact the short side of the first element isolation structure and the short side of the first gate structure.

3. The semiconductor device of claim 2,
   wherein a width of the gate insulating support in the first direction is greater than that of the first gate structure in the first direction.

4. The semiconductor device of claim 2,
   wherein the first gate structure comprises a high dielectric constant insulating layer extending along the upper surface of the field insulating layer and a gate electrode disposed on the high dielectric constant insulating layer,
   wherein the high dielectric constant insulating layer does not extend along sidewalls of the gate insulating support.

5. The semiconductor device of claim 1, wherein the first element isolation structure contacts the first gate structure, and the first element isolation structure and the first gate structure are aligned in the second direction.

6. The semiconductor device of claim 1, further comprising:
a fifth fin pattern which is separated from the fourth fin pattern by a third isolation trench; and
a second element isolation structure which fills the third isolation trench.

7. The semiconductor device of claim 6, further comprising a connection isolation structure which connects an upper portion of the first element isolation structure and an upper portion of the second element isolation structure.

8. The semiconductor device of claim 7, further comprising an interlayer insulating film disposed between the connection isolation structure and the fourth fin pattern.

9. The semiconductor device of claim 6, further comprising an epitaxial pattern disposed on the fourth fin pattern.

10. The semiconductor device of claim 1, wherein the second gate structure intersects the fourth fin pattern.

11. The semiconductor device of claim 1,
wherein an upper surface of the first element isolation structure is at the same height as an upper surface of the first gate structure.

12. A semiconductor device comprising:
a first fin pattern and a second fin pattern aligned in a first direction which is a longitudinal direction;
a third fin pattern which is spaced apart from the first fin pattern in a second direction intersecting the first direction and extends in the first direction;
a fourth fin pattern which is separated from the third fin pattern by a first isolation trench;
a first gate structure which intersects the first fin pattern and has a portion extending along an upper surface of the first fin pattern;
a second gate structure which intersects the second fin pattern and has a portion extending along an upper surface of the second fin pattern;
a third gate structure which intersects the first fin pattern and the third fin pattern;
a first element isolation structure which fills the first isolation trench,
wherein an upper surface of the first element isolation structure is higher than an upper surface of the third fin pattern; and
wherein the topmost surface of the first element isolation structure is at the same height as the topmost surface of the first gate structure.

13. The semiconductor device of claim 12, further comprising:
a gate insulating support which is formed, in a top down view, between a short side of the first element isolation structure and a short side of the first gate structure to contact the short side of the first element isolation structure and the short side of the first gate structure,
wherein a width of the gate insulating support in the first direction is greater than that of the first gate structure in the first direction.

14. The semiconductor device of claim 12, wherein the second gate structure intersects the fourth fin pattern.

15. The semiconductor device of claim 12, further comprising:
a fifth fin pattern which is separated from the fourth fin pattern by a second isolation trench; and
a second element isolation structure which fills the second isolation trench and is connected to the first element isolation structure.

16. A semiconductor device comprising:
a first fin pattern and a second fin pattern which are disposed in an n-type metal oxide semiconductor (NMOS) region and aligned in a first direction which is a longitudinal direction;
a third fin pattern which is disposed in a p-type metal oxide semiconductor (PMOS) region, is spaced apart from the first fin pattern in a second direction intersecting the first direction and extends in the first direction;
a fourth fin pattern which is separated from the third fin pattern by a first isolation trench;
a first gate structure which intersects the first fin pattern and has a portion extending along an upper surface of the first fin pattern;
a second gate structure which intersects the second fin pattern and has a portion extending along an upper surface of the second fin pattern;
a first element isolation structure which fills the first isolation trench, wherein the first element isolation structure and the first gate structure, in a top down view, are spaced apart from each other in the second direction; and
a gate insulating support disposed, in the top down view, between the first gate structure and the first element isolation structure to contact a short side of the first gate structure and a short side of the first element isolation structure,
wherein the topmost surface of the first element isolation structure is at the same height as the topmost surface of the first gate structure.

17. The semiconductor device of claim 16,
wherein a width of the gate insulating support in the first direction is greater than that of the first gate structure in the first direction.

18. The semiconductor device of claim 16, further comprising:
a fifth fin pattern which is separated from the fourth fin pattern by a second isolation trench; and
a second element isolation structure which fills the second isolation trench.

19. The semiconductor device of claim 18, further comprising a connection isolation structure which connects an upper portion of the first element isolation structure and an upper portion of the second element isolation structure.

20. The semiconductor device of claim 18, wherein the gate insulating support crosses between the second element isolation structure and the second gate structure.

* * * * *

UNITED STATES PATENT AND TRADEMARK OFFICE
CERTIFICATE OF CORRECTION

PATENT NO. : 11,195,910 B2
APPLICATION NO. : 16/214659
DATED : December 7, 2021
INVENTOR(S) : Young-Hun Kim, Jae Seok Yang and Hae Wang Lee Page 1 of 1

It is certified that error appears in the above-identified patent and that said Letters Patent is hereby corrected as shown below:

In the Claims

In Claim 1, Column 18, Line 34, delete "the short side" and insert --a short side--.

Signed and Sealed this
Eleventh Day of March, 2025

Coke Morgan Stewart
*Acting Director of the United States Patent and Trademark Office*